United States Patent
Masui et al.

(10) Patent No.: US 8,294,361 B2
(45) Date of Patent: Oct. 23, 2012

(54) ORGANIC ELECTRIC FIELD LIGHT-EMITTING ELEMENT

(75) Inventors: Kensuke Masui, Kanagawa (JP); Wataru Sotoyama, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 104 days.

(21) Appl. No.: 13/006,746

(22) Filed: Jan. 14, 2011

(65) Prior Publication Data
US 2011/0175071 A1 Jul. 21, 2011

(30) Foreign Application Priority Data

Jan. 20, 2010 (JP) ................... 2010-009813
Aug. 13, 2010 (JP) ................... 2010-181403

(51) Int. Cl.
*H01J 1/62* (2006.01)

(52) U.S. Cl. ............ 313/504; 313/506; 252/301.16
(58) Field of Classification Search ............ 313/504, 313/506; 252/301.16
See application file for complete search history.

(56) References Cited

U.S. PATENT DOCUMENTS

| | | | |
|---|---|---|---|
| 7,683,536 B2 * | 3/2010 | Forrest et al. | 313/506 |
| 2001/0019782 A1 | 9/2001 | Igarashi et al. | |
| 2008/0284318 A1 * | 11/2008 | Deaton et al. | 313/504 |

FOREIGN PATENT DOCUMENTS

| | | |
|---|---|---|
| JP | 3929689 B2 | 6/2007 |
| WO | WO 2009/030981 A3 | 3/2009 |

* cited by examiner

*Primary Examiner* — Minh-Loan T Tran
(74) *Attorney, Agent, or Firm* — Birch, Stewart, Kolasch & Birch, LLP.

(57) ABSTRACT

An organic electric field light-emitting element, containing an anode; a cathode; and an organic layer provided therebetween and containing a first organic layer, a second organic layer and a third organic layer laminated in this order from the anode side, wherein the first organic layer contains a first host material in an amount of 10 to 90 mass % and a first hole-transporting phosphorescent material in an amount of 10 to 90 mass %; the second organic layer contains a second host material in an amount of 65 to 96.9 mass %, a second hole-transporting phosphorescent material in an amount of 3 to 30 mass %, and an electron-trapping material in an amount of 0.1 to 5 mass %; the third organic layer contain a hole-blocking material whose T1 is higher than that of the second hole-transporting phosphorescent material by at least 0.1 eV, wherein the second host material, the second hole-transporting phosphorescent material, and the electron-trapping material satisfy the following relationship:

$|HOMO_{t2}|>|HOMO_{h2}|$ $|HOMO_{t2}|>|HOMO_{p2}|$ $|LUMO_{h2}|+0.25\ eV<|LUMO_{t2}|$ $|LUMO_{p2}|+0.25\ eV<|LUMO_{t2}|$ and wherein the total average thickness of the first and second organic layers is at least 40 nm.

6 Claims, 3 Drawing Sheets

ORGANIC ELECTRIC FIELD LIGHT-EMITTING ELEMENT

BACKGROUND OF THE INVENTION

1. Field of the Invention

The present invention relates to an organic electric field light-emitting element (may also referred to as an "organic electroluminescence element", an "organic EL element", and the like).

2. Description of the Related Art

Organic electric field light-emitting elements have characteristics such as of self luminescence and high-speed response, and hence are expected as applications for flat panel displays. Especially since a two layer (laminate) type of organic electric field light-emitting elements, in which a thin hole-transporting organic film (i.e. a hole transporting layer) and a thin electron-transporting organic film (i.e. an electron transporting layer) are laminated were reported, organic electric field light-emitting elements attracted great deals of interests as large-scale luminescence elements which emits light with low voltage of 10 V or lower. The basic structure of the laminate type of the organic electric field light-emitting element is a laminate structure of a positive electrode, a hole transporting layer, a light emitting layer, an electron transporting layer, and a negative electrode.

Various studies and researches have been conducted on such organic electric field light-emitting elements to realize high emission efficiency. For example, there has been a proposal that an iridium complex-based hole-transporting phosphorescent material is added to a light emitting layer (Japanese Patent (JP-B) No. 3,929,689).

However in this proposal, electrons passed through the light emitting layer are accumulated at an interface between the light emitting layer and the hole transporting layer, and part of the accumulated electrons leak to the hole transporting layer, which cause reduction in permanence, and emission efficiency of the resulting element.

In order to solve this problem, there has been a proposal, for example, that the permanence and emission efficiency of an element is improved by changing the basic layer structure from the conventional layer structure, i.e. a hole injection layer, a hole transporting layer, and a light emitting layer, to the structure, i.e. a hole injection layer, a layer serving as both a hole transporting layer and a light emitting layer, and a light emitting layer (see International Application Publication No. WO 2009/030981).

However in this proposal, the location of emission significantly moves depending on the value of the applied electric current, which causes large deviation in chromaticity of the emitted light due to optical interference. Especially in the case of a blue organic electric field light-emitting element, there is a problem that the permanence and emission efficiency of the element cannot be sufficiently improved as well as having the problem of the large deviation in the chromaticity.

Accordingly, it is the current situation that there are great demands for prompt development of an organic electric field light-emitting element, which can realize excellent permanence and emission efficiency of the element and prevention of chromaticity deviation influenced by electric current.

BRIEF SUMMARY OF THE INVENTION

The present invention aims at providing an organic electric field light-emitting element which has improved permanence and emission efficiency thereof, minimized change in the emission location, and reduced chromaticity deviation influenced by electric current applied to the element.

The means for solving the problems are as follows:

<1> An organic electric field light-emitting element, containing:

an anode;

a cathode; and an organic layer containing a first organic layer, a second organic layer, and a third organic layer, provided between the anode and the cathode, where the first organic layer, the second organic layer, and the third organic layer are laminated in this order from the side of the anode, wherein the first organic layer contains a first host material and a first hole-transporting phosphorescent material, and the amount of the first host material and the amount of the first host hole-transporting phosphorescent material in the first organic layer are 10% by mass to 90% by mass, and 10% by mass to 90% by mass, respectively, wherein the second organic layer contains a second host material, a second hole-transporting phosphorescent material, and an electron-trapping material, and the amount of the second host material, the amount of the second hole-transporting phosphorescent material, and the amount of the electron-trapping material in the second organic layer are 65% by mass to 96.9% by mass, 3% by mass to 30% by mass, and 0.1% by mass to 5% by mass, respectively, wherein the third organic layer contain a hole-blocking material whose triplet excitation level (T1) is higher than the triplet excitation level (T1) of the second hole-transporting phosphorescent material by at least 0.1 eV, wherein the second host material, the second hole-transporting phosphorescent material, and the electron-trapping material satisfy the relationship expressed by the following formulae:

$|HOMO_{t2}| > |HOMO_{h2}|$ $|HOMO_{t2}| > |HOMO_{p2}|$ $|LUMO_{h2}| + 0.25\ eV < |LUMO_{t2}|$ $|LUMO_{p2}| + 0.25\ eV < |LUMO_{t2}|$ where $HOMO_{t2}$ is the highest occupied molecular orbital (HOMO) level of the electron-trapping material contained in the second organic layer, $HOMO_{h2}$ is the HOMO level of the second host material, $HOMO_{p2}$ is the HOMO level of the second hole-transporting phosphorescent material, $LUMO_{h2}$ is the lowest unoccupied molecular orbital (LUMO) level of the second host material, $LUMO_{t2}$ is the LUMO level of the electron-trapping material contained in the second organic layer, and $LUMO_{p2}$ is the LUMO level of the second hole-transporting phosphorescent material, and wherein the total of the average thickness of the first organic layer and the average thickness of the second organic layer is at least 40 nm.

<2> The organic electric field light-emitting element according to <1>, wherein the first organic layer further contains 0.1% by mass to 5% by mass of an electron-trapping material, and the first host material, the first hole-transporting phosphorescent material, and the electron-trapping material satisfy the relationship expressed by the following formulae:

$|HOMO_{t1}| > |HOMO_{h1}|$ $|HOMO_{t1}| > |HOMO_{P1}|$ $|LUMO_{h1}| + 0.25\ eV < |LUMO_{t1}|$ $|LUMO_{P1}| + 0.25\ eV < |LUMO_{t1}|$ where $HOMO_{t1}$ is the highest occupied molecular orbital (HOMO) level of the electron-trapping material contained in the first organic layer, $HOMO_{h1}$ is the HOMO level of the first host material, $HOMO_{p1}$ is the HOMO level of the first hole-transporting phosphorescent material, $LUMO_{h1}$ is the lowest unoccupied molecular orbital (LUMO) level of the first host material, $LUMO_{t1}$ is the LUMO level of the electron-trapping material contained in the first organic layer, and $LUMO_{p1}$ is the LUMO level of the first hole-transporting phosphorescent material.

<3> The organic electric field light-emitting element according to any of <1> or <2>, wherein the electron-trapping material is an electron-transporting phosphorescent material.

<4> The organic electric field light-emitting element according to any one of <1> to <3>, wherein the amount of the first hole-transporting phosphorescent material is larger than the amount of the second hole-transporting phosphorescent material by at least 10% by mass.

<5> The organic electric field light-emitting element according to any one of <1> to <4>, wherein the first hole-transporting phosphorescent material and the second hole-transporting phosphorescent material are both iridium complexes.

<6> The organic electric field light-emitting element according to any one of <1> to <5>, wherein the electron-trapping material is a platinum complex.

The present invention solves various problems in the art, and provides an organic electric field light-emitting element which has improved permanence and emission efficiency thereof, minimized change in the emission location, and reduced chromaticity deviation influenced by electric current applied to the element.

Figure 1:
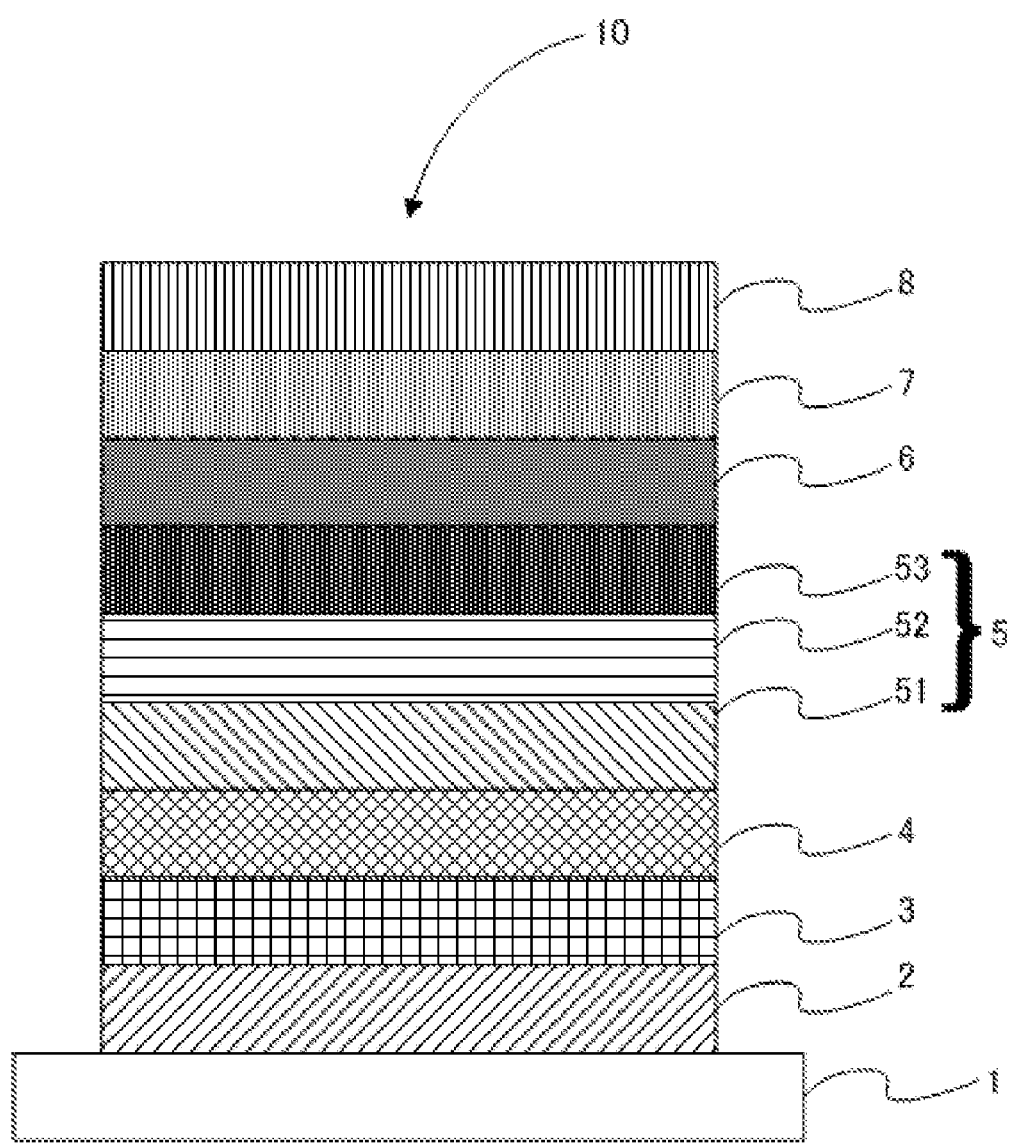
FIG. 1 is a schematic diagram showing one example of the layer structure of the organic electric field light-emitting element of the present invention.

DETAILED DESCRIPTION OF THE INVENTION (Organic Electric Field Light-Emitting Element)

The organic electric field light-emitting element of the present invention contains an anode, a cathode, and an organic layer provided between the anode and cathode, and the organic layer contains a first organic layer, a second organic layer, and a third organic layer laminated in this order from the side of the anode. The organic electric field light-emitting element of the present invention may further contain other layers, if necessary.

<Organic Layer>

The organic layer is formed by laminating a first organic layer, a second organic layer, and a third organic layer in this order from the side of the anode.

The organic layer may include, other than the first organic layer, second organic layer, and third organic layer, various layers such as a hole injection layer, a hole transporting layer, an electron transporting layer, and an electron injection layer.

In the case where the first organic layer and the second organic layer are formed of the same materials at the same formulation ratio, the interface between the first organic layer and the second organic layer is regarded as the face present at the central point of the part of the organic layer including the first organic layer and the second organic layer in the thickness direction.

Examples of the method for forming each layer constituting the organic layer include dry film forming methods such as deposition and sputtering, and wet coating methods such as transferring, printing, coating, inkjet printing and spraying.

<<First Organic Layer and Second Organic Layer>>

The first organic layer is a layer that has a function of a light emitting layer, which receives holes from the side of the anode as the electric field is applied, receives electrons passed through the second organic layer without recombining with holes there, and provide a location for recombination of the holes and the electrons to emit light, as well as having a function of a hole transporting layer, which receives holes from the side of the anode and transports the holes to the side of the cathode as electric filed is applied.

The first organic layer contains a first host material and a first hole-transporting phosphorescent material, and may optionally contain an electron-trapping material, and other components.

The second organic layer is a layer that has a function of a light emitting layer, which receives holes from the side of the anode and electrons from the side of the cathodes as electric field is applied, and provides a location where the holes and the electrons are recombined to emit light.

The second organic layer contains a second host material, a second hole-transporting phosphorescent material, and an electron-trapping material, and may optionally contain other components.

A first host material, a first hole-transporting phosphorescent material and an electron-trapping material contained in the first organic layer, and a second host material, a second hole-transporting phosphorescent material, and an electron-trapping material contained in the second organic layer satisfy the relationship expressed by the following formulae (1) to (4):

$$|HOMO_{t2}| > |HOMO_{h2}| \quad (1)$$

$$|HOMO_{t2}| > |HOMO_{p2}| \quad (2)$$

$$|HOMO_{t1}| > |HOMO_{h1}| \quad (3)$$

$$|HOMO_{t1}| > |HOMO_{p1}| \quad (4)$$

In the formulae above, $HOMO_{t2}$ is the highest occupied molecular orbital (HOMO) level of the electron-trapping material contained in the second organic layer, $HOMO_{h2}$ is the HOMO level of the second host material, $HOMO_{p2}$ is the HOMO level of the second hole-transporting phosphorescent material, $HOMO_{t1}$ is the HOMO level of the electron-trapping material contained in the first organic layer, $HOMO_{h1}$ is the HOMO level of the first host material, and $HOMO_{p1}$ is the HOMO level of the first hole-transporting phosphorescent material.

Note that, the highest occupied molecular orbital (HOMO) level and the lowest unoccupied molecular orbital (LUMO) level are both the calculated values, which are calculated by using a software for calculating molecular orbital of Gaussian, Inc., Gaussian03 (Gaussian 03, Revision D.02, M. J. Frisch, et al., Gaussian, Inc., Wallingford Conn., 2004), and are determined as calculated values ("eV" unit reduced values) which are obtained by structurally optimizing using B3LYP/6-31G* as a keyword. The calculated values obtained in this manner are highly correlated to experimental values.

In the case where the relationships expressed by the formulae (1) to (4) are not satisfied, the driving voltage may be excessively high to thereby reduce the emission efficiency of the resulting element, as the electron-trapping material blocks the movement of holes.

By satisfying the formulae (1) to (4), holes reach an interface between the second organic layer and the below-mentioned third organic layer, where electrons are trapped, via the host material or hole-transporting phosphorescent material having the lower energy level than those of the electron-trapping materials of the first and second organic layers. Therefore, holes and electrons are recombined at the area adjacent to the interface, which means that the location for emission is adjacent to the interface.

The total of the average thickness of the first organic layer and the average thickness of the second organic layer is at least 40 nm, preferably 50 nm or more, and more preferably 60 nm or more.

When the total average thickness thereof is less than 40 nm, the resulting element may have low emission efficiency and less permanence.

The average thickness of the first organic layer is preferably 5 nm or more, more preferably 10 nm or more, and even more preferably 20 nm or more.

When the average thickness is less than 5 nm, the resulting element may have low emission efficiency and less permanence.

The average thickness of the second organic layer is preferably 5 nm or more, more preferably 10 nm or more, and even more preferably 20 nm or more.

When the average thickness is less than 5 nm, the resulting element may have poor emission efficiency and poor durability.

The average thickness of the first organic layer and the average thickness of the second organic layer can be both measured, for example, by a stylus surface profiler. The average thickness of each layer is an average value of values measured on 10 positions.

—First Host Material and Second Host Material—

The amount (proportion) of the first host material in the first organic layer is preferably 10% by mass to 90% by mass, more preferably 40% by mass to 90% by mass, and even more preferably 70% by mass to 90% by mass relative to the mass of the first organic layer.

When the proportion thereof is lower than 10% by mass, or higher than 90% by mass, the driving voltage is excessively high to thereby lower the emission efficiency of the resulting element.

The amount (proportion) of the second host material in the second organic layer is preferably 65% by mass to 96.9% by mass, more preferably 80% by mass to 95% by mass, and even more preferably 80% by mass to 93% by mass relative to the mass of the second organic layer.

When the proportion thereof is lower than 65% by mass, or higher than 96.9% by mass, the driving voltage is excessively high to thereby lower the emission efficiency of the resulting element.

The first host material and the second host material are suitably selected depending on the intended purpose without any restriction. The first host material and the second host material may be the same materials or different materials. The first host material and the second host material (may be referred to as "a host material" for both the first host material and the second host material hereinafter) will be explained hereinafter.

—Host Material—

The host material is suitably selected depending on the intended purpose without any restriction, and examples thereof include anthracene, triphenylene, pyrrole, indole, carbazole, azaindole, azacarbazole, pyrazole, imidazole, polyarylalkane, pyrazoline, pyrazolone, phenylene diamine, aryl amine, amino-substituted chalcone, styryl anthracene, fluorenone, hydrazone, stilbene, silazane, an aromatic tertiary amine compound, a styryl amine compound, an aromatic dimethylidine compound, a porphyrin compound, a polysilane compound, poly(N-vinylcarbazole), aniline copolymers, electrically conductive high-molecular oligomers such as thiophene oligomers, polythiophenes and the like, organic silanes, carbon films, derivatives thereof.

Among them, indole derivatives, carbazole derivatives, azaindole derivatives, azacarbazole derivatives, the aromatic tertiary amine compound, and thiophene derivatives are preferable, and the compounds having an indole slekton, a carbazole skelton, an azaindole skelton, an azacarbazole skelton, or an aromatic tertiary amine skelton in the molecular thereof are particularly preferable.

Specific examples of such host material include those presented below, but not limited to these examples.

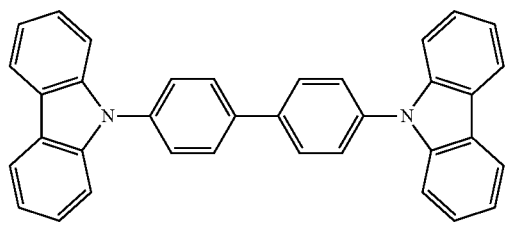

H-1

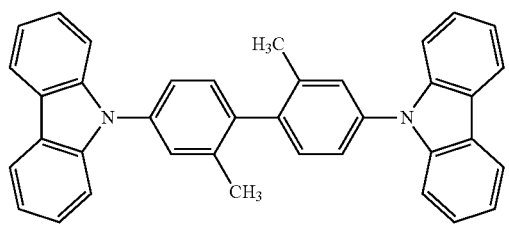

H-2

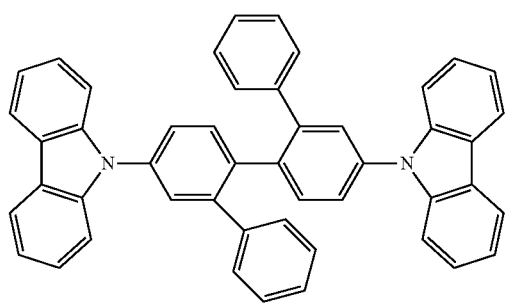

H-3

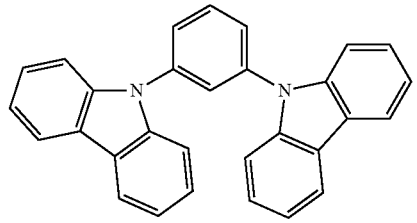

H-4

H-5
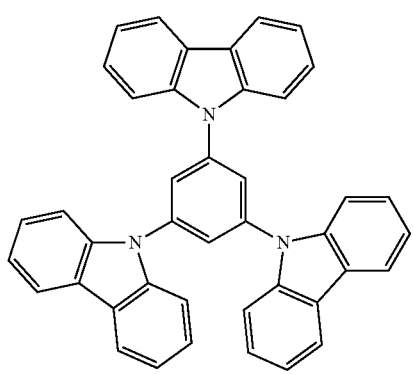
H-6
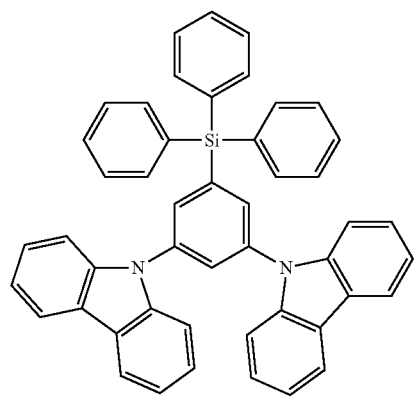
H-7
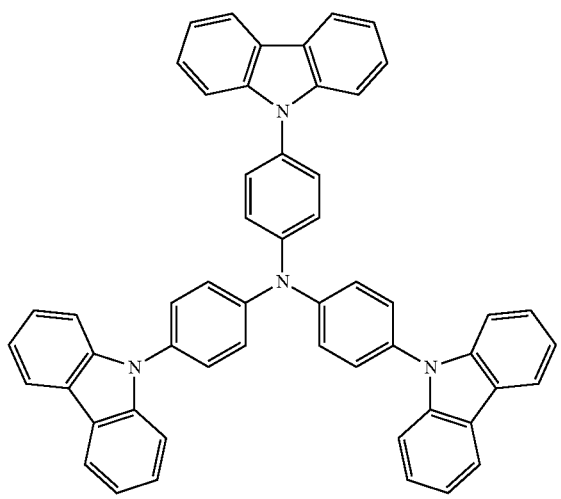
H-8
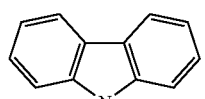
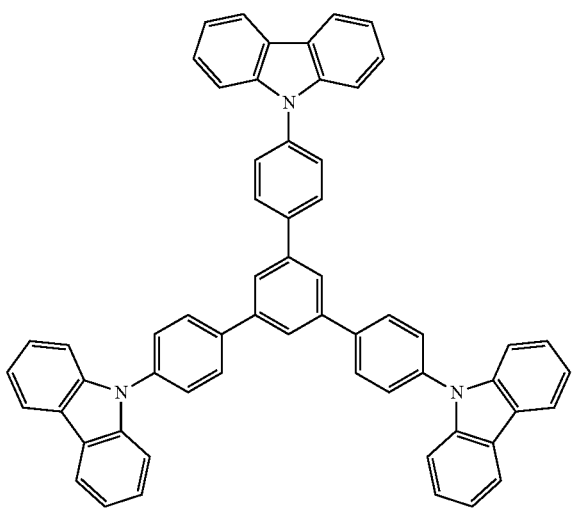
H-9
H-10
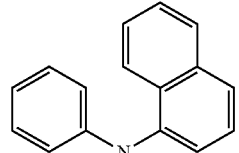
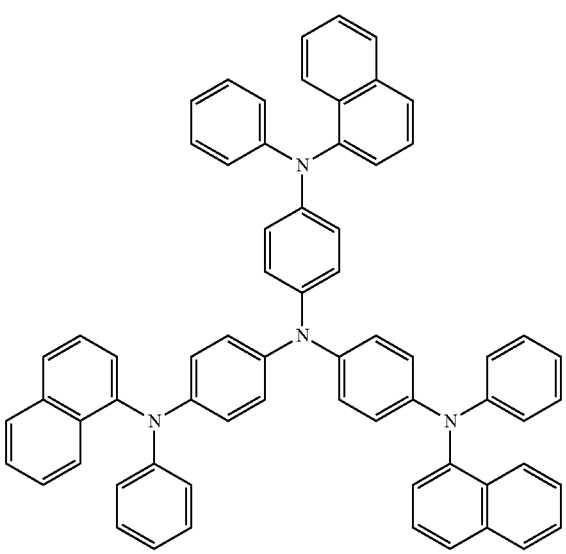
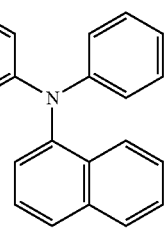

H-11
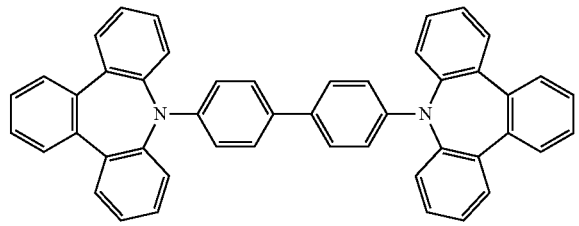
H-12
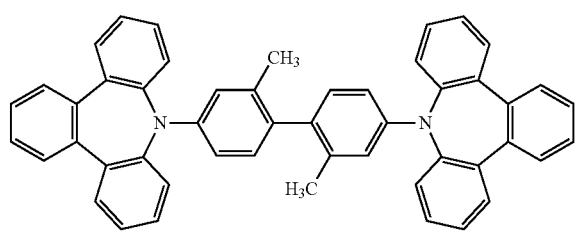
H-13
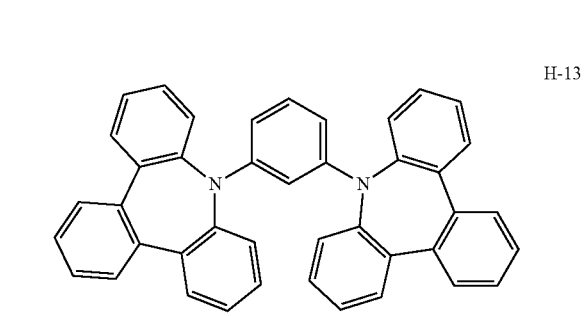
H-14
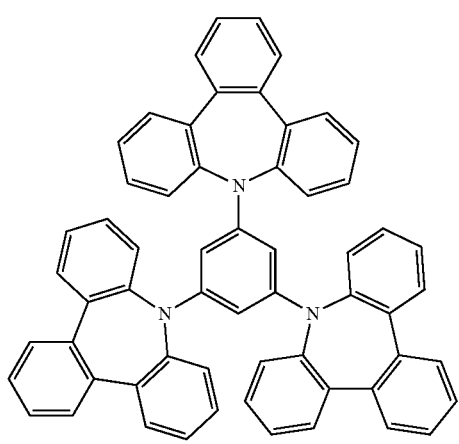
H-15
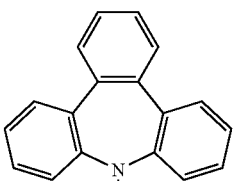
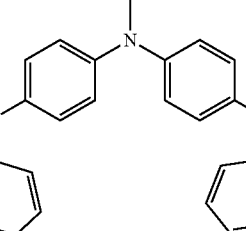
H-16
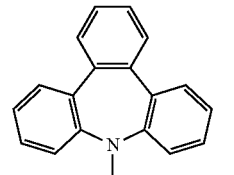
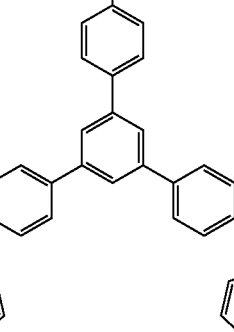
H-17
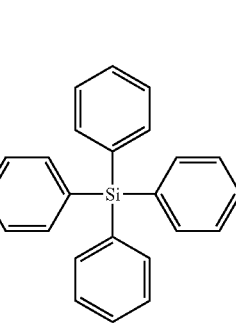

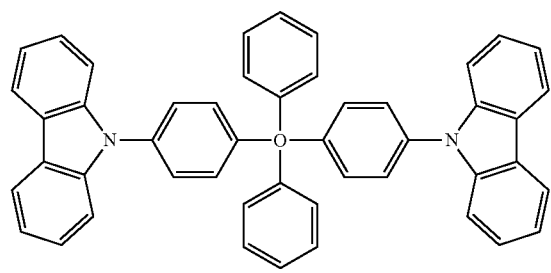
H-18
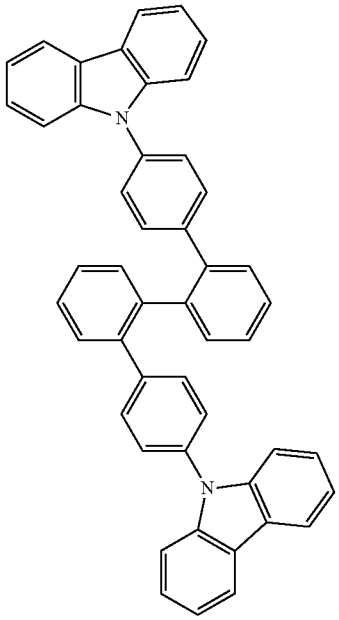
H-21
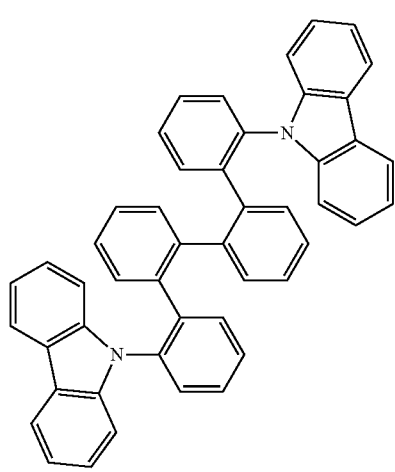
H-19
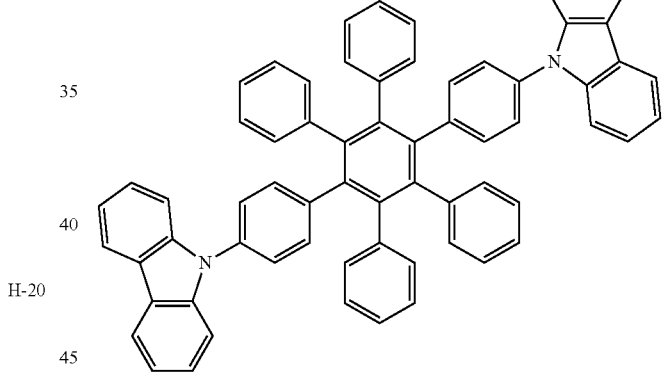
H-22
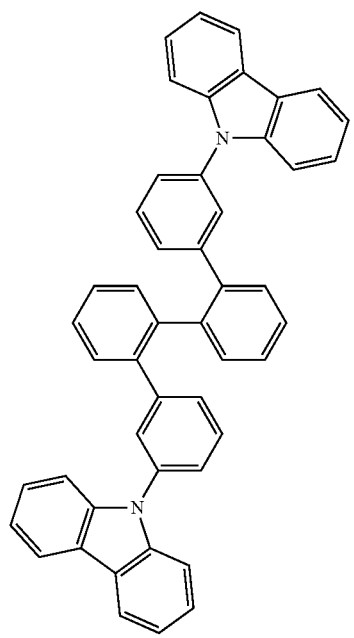
H-20
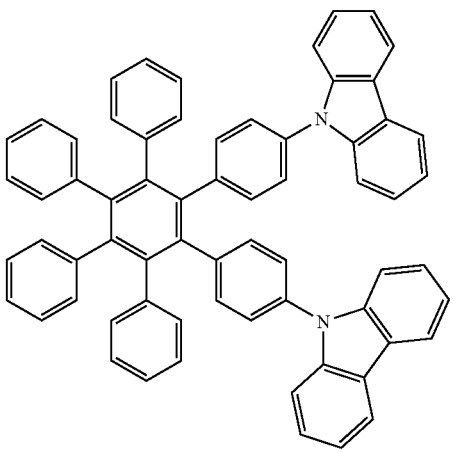
H-23

H-24

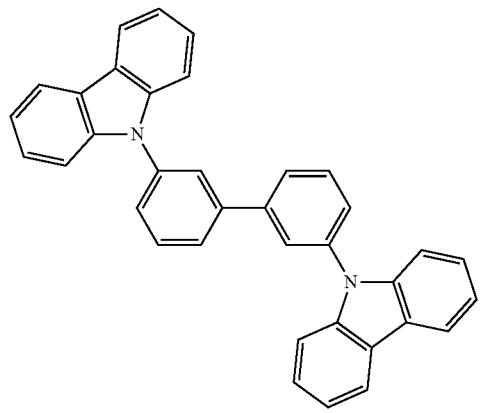

H-28

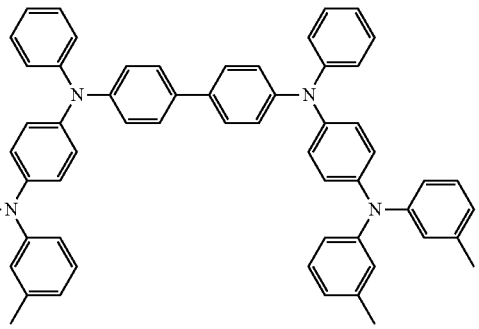

H-25

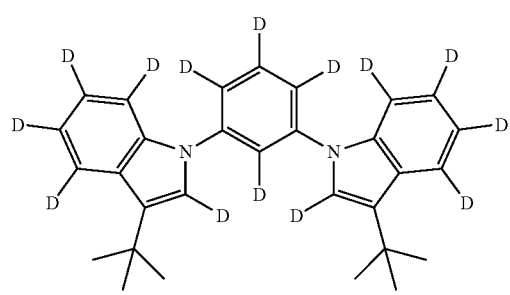

H-29

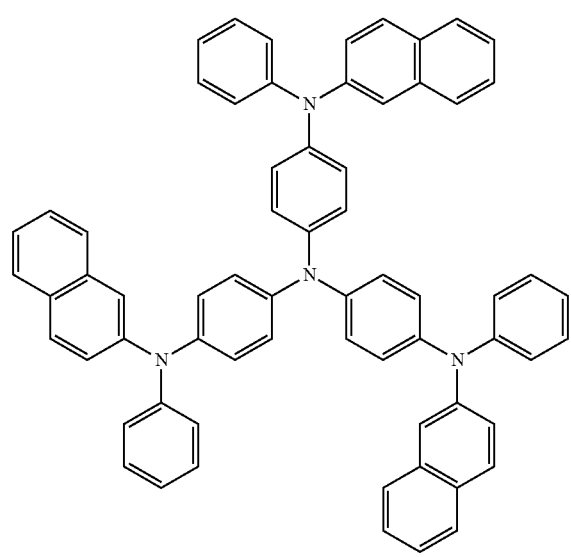

H-26

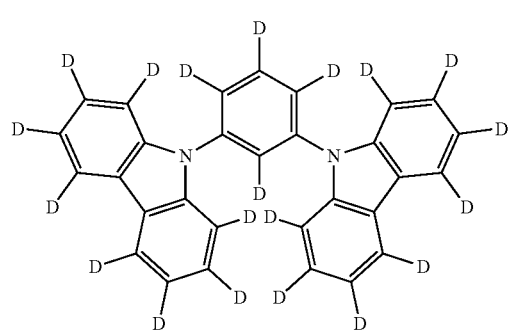

H-27

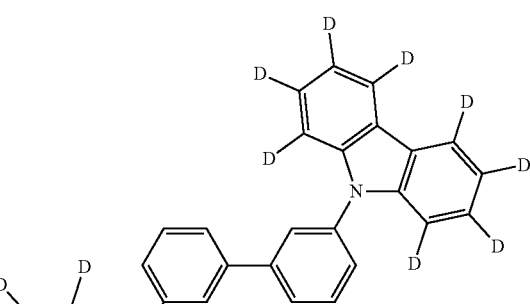

H-30

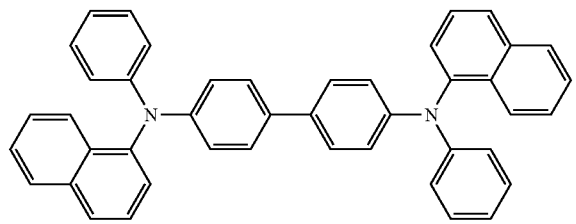

H-31

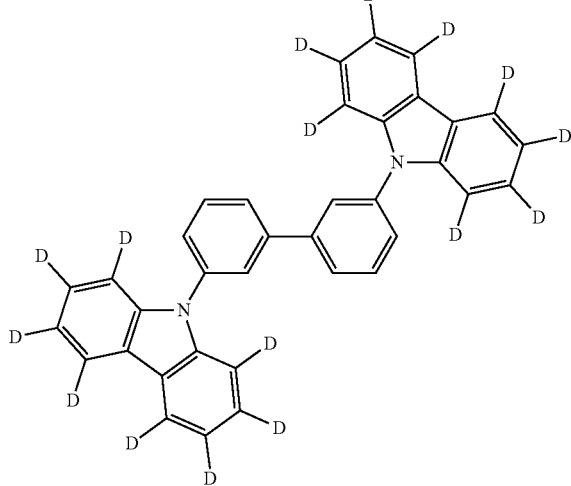

—First Hole-Transporting Phosphorescent Material and Second Hole-Transporting Phosphorescent Material—

The amount (proportion) of the first hole-transporting phosphorescent material in the first organic layer is preferably 10% by mass to 90% by mass, more preferably 15% by mass to 60% by mass, and even more preferably 15% by mass to 40% by mass relative to the mass of the first organic layer.

When the amount thereof is less than 10% by mass, or more than 90% by mass, the drying voltage may be excessively high to thereby lower the emission efficiency of the resulting element.

The amount (proportion) of the second hole-transporting phosphorescent material in the second organic layer is preferably 3% by mass to 30% by mass, more preferably 5% by mass to 20% by mass, and even more preferably 7% by mass to 20% by mass, relative to the mass of the second organic layer.

When the amount thereof is less than 3% by mass or more than 30% by mass, the drying voltage may be excessively high to thereby lower the emission efficiency of the resulting element.

The amount (proportion) of the first hole-transporting phosphorescent material is higher than the amount (proportion) of the second hole-transporting phosphorescent material by at least 10% by mass, more preferably 12.5% by mass or more, and even more preferably 15% by mass or more.

When the amount of the first hole-transporting phosphorescent material is higher than that of the second hole-transporting phosphorescent material by less than 10% by mass, the driving voltage of the resulting element may be excessively high.

The first hole-transporting phosphorescent material and the second hole-transporting phosphorescent material are suitably selected depending on the intended purpose without any restriction provided that they are phosphorescent materials having hole-transporting properties. The first hole-transporting phosphorescent material and the second hole-transporting phosphorescent material may be the same materials or different materials. The first hole-transporting phosphorescent material and the second hole-transporting phosphorescent material (may be also referred to as a "hole-transporting phosphorescent material" for both of the first hole-transporting phosphorescent material and the second hole-transporting phosphorescent material) will be explained hereinafter.

—Hole-Transporting Phosphorescent Material—

The lowest unoccupied molecular orbital (LUMO) level of the hole-transporting phosphorescent material is preferably 0 eV to −2.0 eV, more preferably 0 eV to −1.75 eV, and even more preferably 0 eV to −1.5 eV.

When the LUMO level thereof is higher than 0 eV, or lower than −2.0 eV, the driving voltage may be excessively high to thereby lower the emission efficiency of the resulting element.

Moreover, the highest occupied molecular orbital (HOMO) level of the hole-transporting phosphorescent material is preferably −4.0 eV to −5.5 eV, more preferably −4.0 eV to −5.25 eV, and even more preferably −4.0 eV to −5.0 eV.

When the HOMO level thereof is higher than −4.0 eV, or lower than −5.5 eV the driving voltage may be excessively high to thereby lower the emission efficiency of the resulting element.

Examples of the hole-transporting phosphorescent material include phosphorescent compounds listed in U.S. Pat. Nos. 6,303,238 and 6,097,147, International Application Publication Nos. WO 00/57676, WO 00/70655, WO 01/08230, WO 01/39234, WO 01/41512, WO 02/02714, WO 02/15645, WO 02/44189, WO 05/19373, WO 2004/108857, WO 2005/042444, and WO2005/042550, Japanese Patent Application Laid-Open (JP-A) Nos. 2001-247859, 2002-302671, 2002-117978, 2003-133074, 2002-235076, 2003-123982 and 2002-170684, EP1211257, JP-A Nos. 2002-226495, 2002-234894, 2001-247859, 2001-298470, 2002-173674, 2002-203678, 2002-203679, 2004-357791, 2006-93542, 2006-261623, 2006-256999, 2007-19462, 2007-84635 and 2007-96259, U.S. Patent Application Publication No. 2008/0297033, Japanese translation of International Patent Application Publication (JP-A) No. 2006-501144, JP-A Nos. 2005-220136 and 2007-161673, International Patent Application No. WO 2003/084972, and U.S. Patent Application Publication No. 2006/0251923.

The hole-transporting phosphorescent material is suitably selected depending on the intended purpose without any restriction, but among the compounds disclosed in the literatures listed above, specific examples thereof include complexes each containing ruthenium, rhodium, palladium, tungsten, rhenium, osmium, iridium, platinum, lanthanum, cerium, praseodymium, neodymium, samarium, europium, gadolinium, terbium, dysprosium, holmium, erbium, thulium, ytterbium, lutetium, or the like. Among them, the complex containing rhenium, iridium or platinum is preferable, and the complex containing iridium is particularly preferable as such complex high emission efficiency and long service life (i.e. excellent permanence).

It is preferred that the hole-transporting phosphorescent material do not have an electron-accepting group such as a fluorine atom, a phenyl group, a trifluoromethyl group, and a cyano group from the standpoint of hole transporting properties of the material.

As ligands of the complex, there are exemplified ligands described in "Comprehensive Coordination Chemistry" authored by G. Wilkinson, published by Pergamon Press Ltd. (1987), "Photochemistry and Photophysics of Coordination Compounds" authored by H. Yersin, published by Springer-Verlag Co. in 1987, and "*Yuhki Kinzoku Kagaku—Kiso To Ouyou* (Organic Metal Chemistry—Devices and Applications) authored by Akio Yamamoto, published by Shokabo Publishing Co., Ltd. in 1982.

Examples of the ligand include a halogen ligand, an aromatic carbon ring ligand, a nitrogen-containing heterocyclic ligand, a diketone ligand, a carboxylic acid ligand, an alcoholate ligand, a carbon monoxide ligand, an isonitryl ligand, and a cyano ligand. Among them, the nitrogen-containing heterocyclic ligand is particularly preferable.

Examples of the halogen ligand include a chlorine ligand.

Examples of the aromatic carbon ring ligand include cyclopentadienyl anion, benzene anion, and naphthyl anion.

Examples of the nitrogen-containing heterocyclic ligand include phenylpyridine, benzoquinoline, quinolinol, bipyridyl, and phenanthroline.

Examples of the diketone ligand include acetylacetone.

Examples of the carboxylic acid ligand include an acetic acid ligand.

Examples of the alcoholate ligand include a phenolate ligand.

The complex may contain one transition metal atom in the compound thereof, or may be a binuclear complex having two or more transition metal atoms. In the case of the binuclear complex, the complex may contain two or more transmition metal atoms that are different from each other. Among them, as the hole-transporting phosphorescent material, those expressed by the following formulae can be listed as examples, but it is not limited to these examples.

P-1
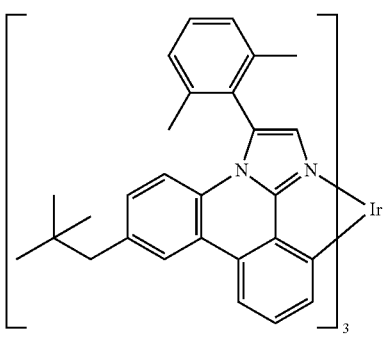

P-2
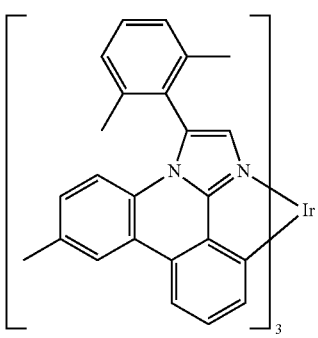

P-3
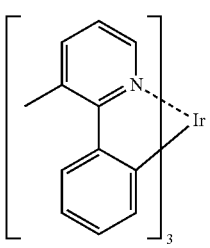

P-4
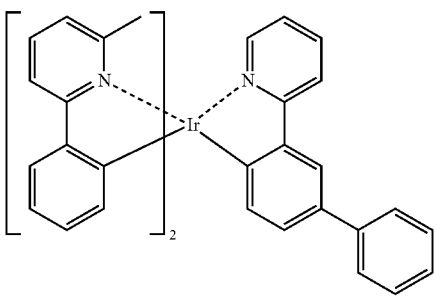

P-5
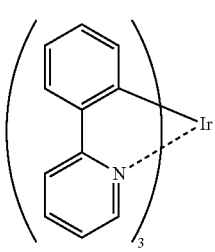

P-6
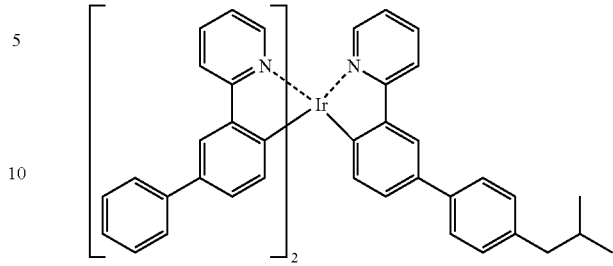

P-7
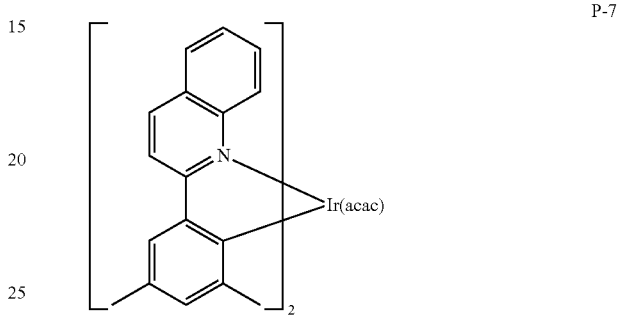

P-8
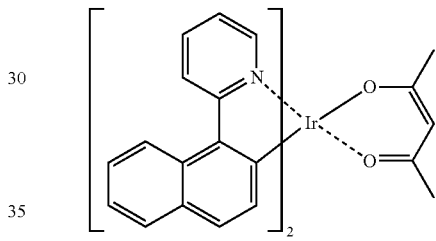

P-9
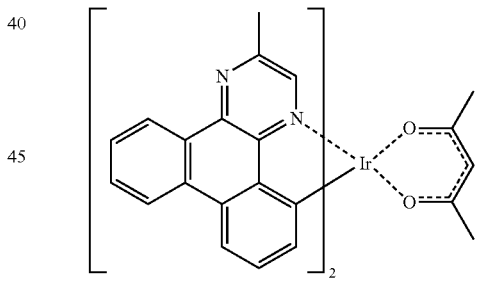

—Electron-Trapping Material—

The electron-trapping material is added for trapping electrons.

The electron-trapping material is added at least to the second organic layer, but it is preferably added to both the first organic layer and the second organic layer.

The electron-trapping material added to the first organic layer and the electron-trapping material added to the second organic layer may be the same materials or different materials.

In order to stably trap electrons, the LUMO level of the electron-trapping to material needs to be higher than the LUMO levels of the host material and the hole-transporting phosphorescent material, and the electron-trapping material, the host material and the hole-transporting phosphorescent material preferably satisfy the relationship expressed by the following formulae (5) to (8):

$$|LUMO_{h2}|+0.25\ eV<|LUMO_{t2}| \quad (5)$$

$$|LUMO_{p2}|+0.25\ eV<|LUMO_{t2}| \quad (6)$$

$$|LUMO_{h1}|+0.25\ eV<|LUMO_{t1}| \quad (7)$$

$$|LUMO_{p1}|+0.25\ eV<|LUMO_{t1}| \quad (8)$$

In the formulae above, $LUMO_{h2}$ is the lowest unoccupied molecular orbital (LUMO) level of the second host material, $LUMO_{t2}$ is the LUMO level of the electron-trapping material contained in the second organic layer, $LUMO_{p2}$ is the LUMO level of the second hole-transporting phosphorescent material, $LUMO_{h1}$ is the lowest unoccupied molecular orbital (LUMO) level of the first host material, $LUMO_{t1}$ is the LUMO level of the electron-trapping material contained in the first organic layer, and $LUMO_{p1}$ is the LUMO level of the first hole-transporting phosphorescent material.

With respect to (5), the value of $(|LUMO_{t2}|-|LUMO_{h2}|)$ is preferably 0.25 eV or more, more preferably 0.3 eV or more, and even more preferably 0.4 eV or more.

When the value of $(|LUMO_{t2}|-|LUMO_{h2}|)$ is less than 0.25 eV, the emission efficiency of the resulting element may be low.

With respect to (6), the value of $(|LUMO_{t2}|-|LUMO_{p2}|)$ is preferably 0.25 eV or more, more preferably 0.3 eV or more, and even more preferably 0.4 eV or more.

When the value of $(|LUMO_{t2}|-|LUMO_{p2}|)$ is less than 0.25 eV, the emission efficiency of the resulting element may be low.

With respect to (7), the value of $(|LUMO_{t1}|-|LUMO_{h1}|)$ is preferably 0.25 eV or more, more preferably 0.3 eV or more, and even more preferably 0.4 eV or more.

When the value of $(|LUMO_{t1}|-|LUMO_{h1}|)$ is less than 0.25 eV, the emission efficiency of the resulting element may be low.

With respect to (8), the value of $(|LUMO_{t1}|-|LUMO_{p1}|)$ is preferably 0.25 eV or more, more preferably 0.3 eV or more, and even more preferably 0.4 eV or more.

When the value of $(|LUMO_{t1}|-|LUMO_{p1}|)$ is less than 0.25 eV, the emission efficiency of the resulting element may be low.

The amount (proportion) of the electron-trapping material in the first organic layer or the second organic layer is preferably 0.1% by mass to 5% by mass, more preferably 0.1% by mass to 4% by mass, and even more preferably 0.3% by mass to 3% by mass, relative to the mass of the first organic layer or the second organic layer.

When the amount thereof is less than 0.1% by mass, the emission efficiency of the resulting element may be low. When the amount thereof is more than 5% by mass, the deviation in chromaticity of emission color may be large.

The lowest unoccupied molecular orbital (LUMO) level of the electron-trapping material is preferably −1.5 eV to −3.0 eV, more preferably −1.75 eV to −3.0 eV, and even more preferably −2.0 eV to −3.0 eV.

When the LUMO level thereof is lower than −1.5 eV or higher than −3.0 eV, the drying voltage may be excessively high to thereby lower the emission efficiency of the resulting element.

Moreover, the highest occupied molecular orbital (HOMO) level of the electron-trapping material is preferably −5.25 eV to −7.0 eV, more preferably −5.5 eV to −7.0 eV, and even more preferably −5.75 eV to −7.0 eV.

When the HOMO level thereof is lower than −5.25 eV or higher than −7.0 eV, the drying voltage may be excessively high to thereby lower the emission efficiency of the resulting element.

Examples of the electron-trapping material include: metal complexes of triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodiimide derivatives, fluorenylidene methane derivatives, distyrylpyrazine derivatives, heterocyclic tetracarboxylic anhydride (e.g. naphthalene perylene), phthalocyanine derivatives, and 8-quinolinol derivatives; and metal complexes having ligands such as metal phthalocyanine, benzooxazole, and benzothiazole.

It is preferred that an electron-transporting phosphorescent material be used as the electron-trapping material as it has high emission efficiency and long service life.

The electron-transporting phosphorescent material is suitably selected depending on the intended purpose without any restriction, but preferable examples thereof include metal complex compounds, benzimidazole derivatives, imidazopyridine derivatives, pyridine derivatives, pyrimidine derivatives, and triazine derivatives. Among them, the metal complex compound is preferable in view of the obtainable service life of the resulting element. As the metal complex compound, a complex compound including a ligand that has at least one nitrogen atom, oxygen atom, or sulfur atom coordinated to a metal.

Examples of the metal ion contained in the metal complex compound include ruthenium ion, rhodium ion, palladium ion, tungsten ion, rhenium ion, osmium ion, iridium ion, platinum ion, lanthanum ion, cerium ion, praseodymium ion, neodymium ion, samarium ion, europium ion, gadolinium ion, terbium ion, dysprosium ion, holmium ion, erbium ion, thulium ion, ytterbium ion, and lutetium ion. Among them, the complex containing a ruthenium ion, rhodium ion, palladium ion, or platinum ion is preferable as it has a high energy of LUMO, and high electron-trapping performance, and the complex containing a platinum ion, which is high in LUMO and has strong electron-trapping performance, is particularly preferable.

It is particularly preferred that the electron-transporting phosphorescent material contain at least one electron-accepting group such as a fluorine atom, a phenyl group, a trifluoromethyl group, and a cyano group to give the desirable electron-transporting properties.

The ligand contained in the metal complex may be selected from various ligands known in the art, and examples thereof include those described in "Photochemistry and Photophysics of Coordination Compounds" authored by H. Yersin, published by Springer-Verlag Co. in 1987, and "*Yuhki Kinzoku Kagaku—Kiso To Ouyou* (Organic Metal Chemistry, Basic to Its Applications) authored by Akio Yamamoto, published by Shokabo Publishing Co., Ltd. in 1982, and the like.

The ligand is preferably a nitrogen-containing heterocyclic ligand (preferably of C1 to C30, more preferably C2 to C20, even more preferably C3 to C15), and may be a monodentate ligand, or a bidentate or high polydentate ligand, preferably a ligand having the denticity of 2 to 6. Moreover, it is also preferable that mixed ligands of the ligand having the denticity of 2 to 6 and a monodentate ligand are also preferable for the ligand.

Examples of the ligand include an azine ligand, a hydroxyphenylazole ligand, an alkoxy ligand, an aryloxy ligand, a heteroaryloxy ligand, an alkylthio ligand, an arylthio ligand, a heteroarylthio ligand, a siloxy ligand, an aromatic hydrocarbon anion ligand, an aromatic heterocyclic anion ligand, and an indolenine anion ligand. Among them, a nitrogen-containing heterocyclic ligand, aryloxy ligand, heteroaryloxy group, and siloxy ligand are preferable, and the nitrogen-containing heterocyclic ligand, aryloxy ligand, siloxy ligand, aromatic hydrocarbon anion ligand, aromatic heterocyclic anion ligand are more preferable.

Examples of the azine ligand include a pyridine ligand, bipyridyl ligand, and ter-pyridine ligand.

Examples of the hydroxyphenylazole ligand include a hydroxyphenylbenzimidazole ligand, hydroxyphenylbenzoxazole ligand, hydroxyphenylimidazole ligand, and hydroxyphenylimidazopyridine ligand.

The alkoxy ligand preferably has 1 to 30 carbon atoms, more preferably 1 to 20 carbon atoms, and even more preferably 1 to 10 carbon atoms, and examples thereof include methoxy, ethoxy, phenoxy, butoxy, and 2-ethylhexyloxy.

The aryloxy ligand preferably has 6 to 30 carbon atoms, more preferably 6 to 20 carbon atoms, and even more preferably 6 to 12 carbon atoms, and examples thereof include phenyloxy, 1-nephthyloxy, 2-nephthyloxy, 2,4,6-trimethylphenyloxy, and 4-biphenyloxy.

The heteroaryloxy ligand preferably has 1 to 30 carbon atoms, more preferably 1 to 20 carbon atoms, and even more preferably 1 to 12 carbon atoms, and examples thereof include pyridyloxy, pyrazyloxy, pyrimidyloxy, and quinolyloxy.

The alkylthio ligand preferably has 1 to 30 carbon atoms, more preferably 1 to 20 carbon atoms, and even more preferably 1 to 12 carbon atoms, and examples thereof include methylthio and ethylthio.

The arylthio ligand preferably has 6 to 30 carbon atoms, more preferably 6 to 20 carbon atoms, and even more preferably 6 to 12 carbon atoms, and examples thereof include phenylthio.

The heteroarylthio ligand preferably has 1 to 30 carbon atoms, more preferably 1 to 20 carbon atoms, and even more preferably 1 to 12 carbon atoms, and examples thereof include pyridylthio, 2-benzimizolylthio, 2-benzoxazolylthio, and 2-benzthiazolylthio.

The siloxy ligand preferably has 1 to 30 carbon atoms, more preferably 3 to 25 carbon atoms, and even more preferably 6 to 20 carbon atoms, and examples thereof include a triphenylsiloxy group, triethoxysilosy group, and triisopropylsiloxy group.

The aromatic hydrocarbon anion ligand preferably has 6 to 30 carbon atoms, more preferably 6 to 25 carbon atoms, and even more preferably 6 to 20 carbon atoms, and examples thereof include a phenyl anion, naphthyl anion, and anthranil anion.

The aromatic heterocyclic anion ligand preferably has 1 to 30 carbon atoms, more preferably 2 to 25 carbon atoms, and even more preferably 2 to 20 carbon atoms, and examples thereof include a pyrrole anion, pyrazole anion, pyrazole anion, triazole anion, oxazole anion, benzoxazole anion, thiazole anion, benzthiazole anion, thiophene anion, and benzthiophene anion.

Examples of such electron-trapping material include the materials listed below, but not limited to these.

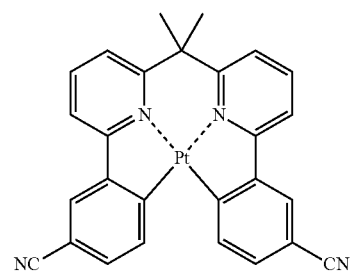

D-1

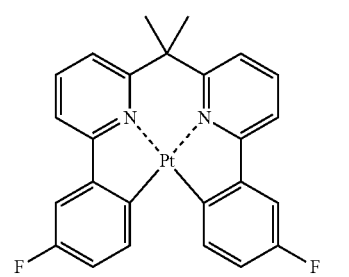

D-2

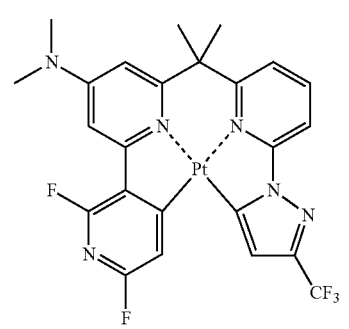

D-3

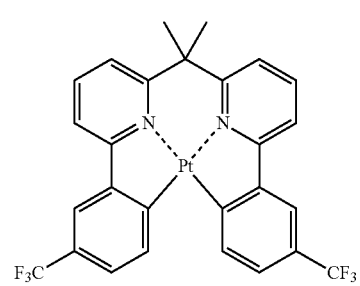

D-4

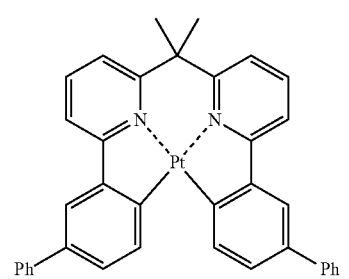

D-5

-continued
D-6
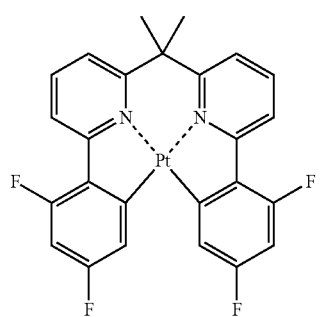
D-7
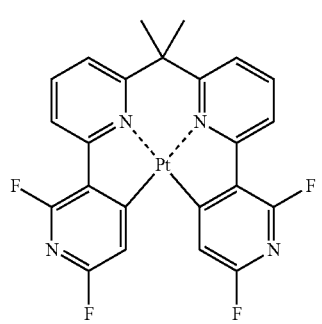
D-8
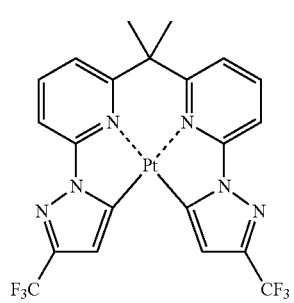
D-9
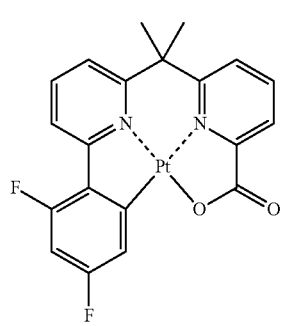
D-10
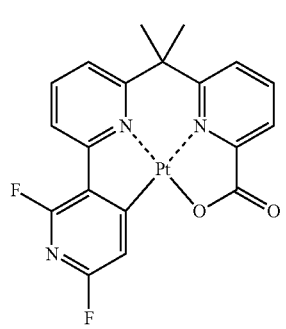
-continued
D-11
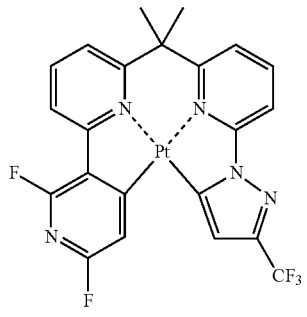
D-12
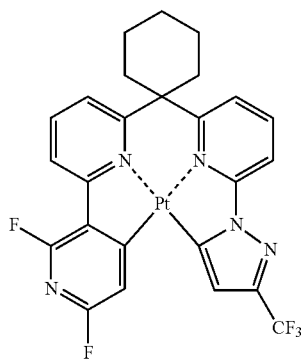
D-13
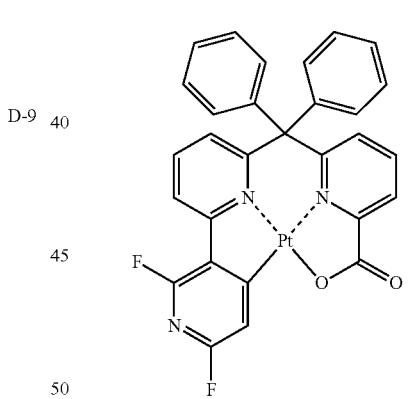
D-14
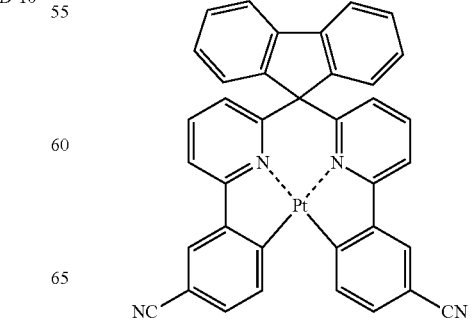

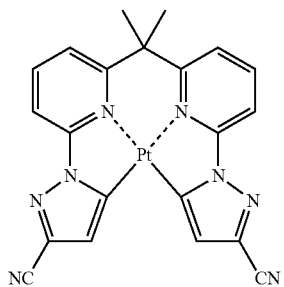

D-15

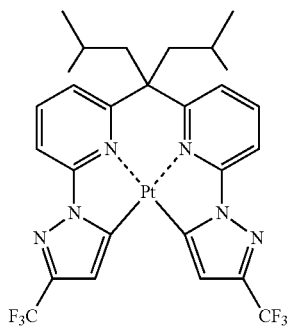

D-16

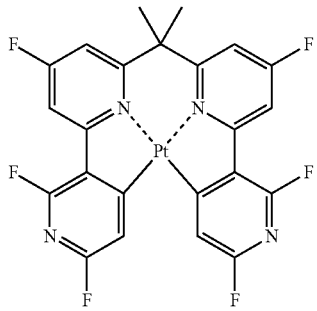

D-17

<<Third Organic Layer>>

The third organic layer is a layer having functions of transporting electrons injected from the cathode to the second organic layer, while preventing holes transported from the side of the anode to the second organic layer from passing through to the cathode, and the third organic layer is provided so as to be adjacent to the second organic layer.

The third organic layer contains a hole-blocking material, and may further contain other substances, if necessary.

The hole-blocking material is suitably selected depending on the intended purpose without any restriction, provided that it can transport electrons injected from the cathode to the second organic layer as well as preventing holes transported from the side of the anode to the second organic layer from passing through to the cathode. Examples of the hole-blocking material include an aluminum complex, phenanthroline derivatives, a triphenylene compound, and a carbazole compound.

The triplet excitation level (T1) of the hole-blocking material needs to be higher than the triplet excitation level (T1) of the second hole-transporting phosphorescent material by at least 0.1 eV, preferably 0.2 eV or more, more preferably 0.3 eV or more.

When the difference between the triplet excitation level of the hole-blocking material and that of the second hole-transporting phosphorescent material is less than 0.1 eV, excitons are scattered to the third organic layer (hole-blocking layer), which may lower the emission efficiency of the resulting element.

By making the triplet excitation level of the hole-blocking material higher than the triplet excitation level of the second hole-transporting phosphorescent material by 0.1 eV or more, holes transported from the side of the anode to the second organic layer are blocked at an interface between the second organic layer and the third organic layer as shown with the formulae (1) to (4). Electrons injected from the cathode are collided with holes at the interface at the time when the electrons are transported from the third organic layer to the second organic layer. By making the triplet excitation level of the hole-blocking material higher than the triplet excitation level of the second hole-transporting phosphorescent material by 0.1 eV or more, light is efficiently emitted mainly at the interface.

Note that, the triplet excitation level (T1) of the hole-blocking material is determined as an end value of the short wavelength side of the emission spectrum thereof, which is obtained from the deposition film of the hole-blocking material at 77K. Moreover, the triplet excitation level (T1) of the second hole-transporting phosphorescent material is determined as an end value of the short wavelength side of the emission spectrum, which is obtained from the film of mCP doped with 10% by mass of the hole-transporting phosphorescent material relative to the mass of mCP, at room temperature.

In order to block holes in the second organic layer, the HOMO level of the hole-blocking material needs to be larger than the HOMO levels of the host material and the hole-transporting phosphorescent material, and these materials preferably satisfy the relationship expressed by the following formula.

$$|HOMO_{p2}|+0.25\ eV<|HOMO_{hb1}| \quad (9)$$

In the formula (9), $HOMO_{p2}$ is the HOMO level of the second hole-transporting phosphorescent material, and $HOMO_{hb1}$ is the HOMO level of the hole-blocking material.

With respect to (9), the value of $(|HOMO_{hb1}|-|HOMO_{p2}|)$ is preferably 0.25 eV or more, more preferably 0.3 eV or more, and even more preferably 0.4 eV or more.

When the value of $(|HOMO_{hb1}|-|HOMO_{p2}|)$ is less than 0.25 eV, emission efficiency of the resulting element may be low.

The average thickness of the third organic layer is preferably 1 nm to 20 nm, more preferably 3 nm to 15 nm, and even more preferably 3 nm to 10 nm.

When the average thickness thereof is less than 1 nm, the emission efficiency of the resulting element may be low. When the average thickness thereof is more than 20 nm, the driving voltage for the resulting element may be high.

<<Electron Injection Layer and Electron Transporting Layer>>

The electron injection layer and the electron transporting layer are layers having functions of receiving electrons from the side of the cathode and transporting to the side of the anode. The electron injection layer and electron transporting layer may each have a single-layer structure, or a multi-layer structure formed of a plurality of layers in which each layer may be formed of the identical formulation or different formulation.

The electron injection layer and electron transporting layer are suitably selected depending on the intended purpose without any restriction. Examples of the material of these layers include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodiimido derivatives, fluorenylidene methane derivatives, distyrylpyrazine derivatives, heterocyclic tetracarboxylic acid anhydride such as naphthalene perylene, metal complex such as phthalocyanine derivatives and 8-quinolinol derivatives, and a metal complex having a ligand of metal phthalocyanine, benzoxazole, or benzthiazole.

The electron injection layer and electron transporting layer can each contain a hole-accepting dopant.

The hole-accepting dopant may be an inorganic compound or organic compound, as long as it has properties to accept holes and reduce organic compounds.

The inorganic compound is suitably selected depending on the intended purpose without any restriction, and examples thereof include alkali metals, alkaline earth metals, and metal oxides thereof.

The thickness of the electron injection layer and the thickness of the electron transporting layer are both preferably 1 nm to 5 more preferably 5 nm to 1 μm, and even more preferably 10 nm to 500 nm.

<<Hole Injection Layer and Hole Transporting Layer>>

The hole injection layer and the hole transporting layer are layers having functions of receiving holes from the anode or the side of the anode and transporting to the side of the cathode. The hole injection layer and hole transporting layer may each have a single-layer structure, or multi-layer structure formed of a plurality of layers in which each layer has the identical formulation or different formulation from other layers.

The hole-injecting material or hole-transporting material used for these layers may be a low-molecular compound or high-molecular compound, or inorganic compound.

The hole-injecting material and hole-transporting material are suitably selected depending on the intended purpose without any restriction, and examples thereof include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, phthalocyanine compounds, porphyrin compounds, thiophene compounds, organic silane derivatives, carbon, molybdenum trioxide, and the like. These may be used independently or in combination.

An electron-accepting dopant may be introduced into the hole injection layer or the hole transport layer in the organic EL element of the present invention.

As the electron-accepting dopant to be introduced into the hole injection layer or the hole transport layer, either or both of an inorganic compound or an organic compound may be used as long as the compound has electron accepting property and a property for oxidizing the organic compound.

The inorganic compound is suitably selected depending on the intended purpose without any restriction, and examples thereof include metal halides, and metal oxides.

Examples of the metal halides include iron (II) chloride, aluminum chloride, gallium chloride, indium chloride, and antimony pentachloride.

Examples of the metal oxides include vanadium pentaoxide, and molybdenum trioxide.

The organic compound is suitably selected depending on the intended purpose without any restriction, and examples thereof include: compounds having a substituent such as a nitro group, a halogen, a cyano group, and a trifluoromethyl group; a quinone compound; an acid anhydride compound; and fullerene.

These electron-accepting dopants may be used independently or in combination.

The amount of the electron-accepting dopant for use may be varied depending on the material used as the electron-accepting dopant, but it is preferably 0.01% by mass to 50% by mass, more preferably 0.05% by mass to 50% by mass, and even more preferably 0.1% by mass to 30% by mass, relative to the amount of the hole transporting material or hole injecting material.

The average thicknesses of the hole injection layer and the hole transporting layer are respectively preferably 1 nm to 500 nm, more preferably 5 nm to 200 nm, and even more preferably 10 nm to 100 nm.

<Anode>

The anode is suitably selected depending on the intended purpose without any restriction, provided that it has functions as an electrode for providing holes to the organic layer. In view of the characteristics of the organic electric field light-emitting element of the present invention, at least either of the anode and the below-discussed cathode is preferably transparent.

The shape, structure, size and the like of the anode are suitably selected from the conventional electrode materials known in the art depending on the use of the organic electric field light-emitting element, and intended purpose without any restriction.

Examples of the material constituting the anode include conductive metal oxide, metal, a mixture or laminate of the metal and the conductive metal oxide, an inorganic conductive material, an organic conductive material, a laminate of ITO and the above-listed material(s).

Examples of the conductive metal oxide include antimony or fluorine-doped tin oxide (ATO, FTO), tin oxide, zinc oxide, indium oxide, indium tin oxide (ITO), and indium zinc oxide (IZO).

Examples of the metal include gold, silver, chromium, and nickel.

Examples of the inorganic conductive material include copper iodide, and copper sulfide.

Examples of the organic conductive material include polyaniline, polythiophene, and polypyrrole.

The method for forming the anode is suitably selected from methods known in the art without any restriction. Examples thereof include wet methods, chemical methods, and physical methods.

Examples of the wet methods include printing, and coating.

Examples of the chemical methods include CVD, and plasma CVD.

Examples of the physical methods include vacuum vaoir deposition, sputtering, ion-plating.

In the case where patterning is performed to form the anode, the patterning may be performed by chemical etching such as photolithography, or may be performed by physical etching such as using laser. Alternatively, the patterning may be performed by vacuum deposition or sputtering using a mask, or performed by a lift-off method, or a printing method.

<Cathode>

The cathode is suitably selected depending on the intended purpose without any restriction, provided that it has functions as an electrode for injecting electrons to the organic layer.

The shape, structure, size and the like of the cathode are suitably selected from the conventional electrode materials known in the art depending on the use of the electroluminescence element and intended use, without any restriction.

Examples of the material constituting the cathode include alkali metal, alkaline earth metal, gold, silver, lead, aluminum, sodium-potassium alloy, lithium-aluminum alloy, magnesium-silver alloy, and rare-earth metal such as indium and ytterbium. These may be used independently, but preferably used in combination for realizing both stability and electron-injecting properties.

Among them, the alkali metal and alkaline earth metal are preferable in terms of their desirable electron-injecting properties, a material mainly formed of aluminum is particularly preferable in view of its excellent storage stability.

The material mainly formed of aluminum means aluminum alone, alloy of aluminum and 0.01% by mass to 10% by mass of alkali metal or alkaline earth metal, or a mixture thereof (e.g. lithium-aluminum alloy, magnesium-aluminum alloy, etc.).

The formation of the cathode is suitably performed according to the methods known in the art without any restriction, and examples of the formation method thereof include a wet method, a chemical method, and a physical method.

Examples of the wet method include printing and coating.

Examples of the chemical method include CVD, and plasma CVD.

Examples of the physical method include vacuum deposition, sputtering, and ion-plating.

In the case where patterning is performed to form the cathode, the patterning may be performed by chemical etching such as photolithography, or may be performed by physical etching such as using laser. Alternatively, the patterning may be performed by vacuum deposition or sputtering using a mask, or performed by a lift-off method, or a printing method.

<Other Layers>
—Substrate—

The organic electric field light-emitting element of the present invention is preferably formed on or above a substrate, and the organic electric field light-emitting element may be formed on the substrate so that the anode and the substrate are in contact with each other, or formed on the substrate via an intermediate layer.

The material of the substrate is suitably selected depending on the intended purpose without any restriction, and examples thereof include inorganic materials and organic materials.

Examples of the inorganic materials include yttria stabilized zirconia (YSZ), alkali-free glass, and soda-lime glass.

Examples of the organic materials include polyethylene terephthalate, polybutylene phthalate, polyethylene naphthalate, polystyrene, polycarbonate, polyether sulfone, polyallylate, polyimide, polycycloolefin, norbornene resin, and poly(chlorotrifluoroethylene).

The shape, structure, size, and the like of the substrate are suitably selected depending on the intended use and application of the resulting light emitting element, without any restriction. Generally, the shape of the substrate is preferably a plate shape.

The structure of the substrate may be a single-layer structure or a laminate structure, and the substrate may be formed of a single member or formed of two or more members. The substrate may be clear or opaque, and in case of the clear substrate it may be colorless or colored.

To the substrate, a moisture barrier layer (a gas barrier layer) can be provided on its surface or back surface.

Examples of the material of the moisture barrier layer (the gas barrier layer) include inorganic materials such as silicon nitride and silicon oxide.

The moisture barrier layer (the gas barrier layer) can be formed, for example, by high frequency sputtering.

—Protective Layer—

The organic electric field light-emitting element of the present invention may be protected with a protective layer.

The material contained in the protective layer is suitably selected depending on the intended purpose without any restriction, provided that it has functions of preventing substances, which deteriorate the element, such as moisture and oxygen, from penetrating into the element. Examples of such material include In, Sn, Pb, Au, Cu, Ag, Al, Ti, Ni, MgO, SiO, $SiO_2$, $Al_2O_3$, GeO, NiO, CaO, BaO, $Fe_2O_3$, $Y_2O_3$, $TiO_2$, $SiN_x$, $SiN_xO_y$, $MgF_2$, LiF, $AlF_3$, $CaF_2$, polyethylene, polypropylene, polymethylmethacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer formed by copolymerizing a monomer mixture containing tetrafluoroethylene and at least one comonomer, fluorine-containing copolymer having a cyclic structure in its copolymer principle chain, a water-absorbing material having water absorption of 1% or higher, and a moisture proof material having water absorption of 0.1% or lower.

The method for forming the protective layer is suitably selected depending on the intended purpose without any restriction, and examples thereof include vacuum deposition, sputtering, reactive sputtering, molecular beam epitaxy (MBE), a cluster ion beam method, ion-plating, a plasma polymerization method (high frequency wave excited ion-plating), plasma CVD, laser CVD, thermal CVD, gas-source CVD, coating, printing, and transferring.

—Sealing Container—

The organic electric field light-emitting element of the present invention may be entirely sealed by a sealing container. Moreover, a moisture absorbent or an inactive liquid may be injected into the space between the sealing container and the organic electric field light-emitting element.

The moisture absorbent is suitably selected depending on the intended purpose without any restriction, and examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolite, and magnesium oxide.

The inactive liquid is suitably selected depending on the intended purpose without any restriction, and examples thereof include paraffin, fluid paraffin, fluorosolvents, chlorine solvents, and silicone oil.

—Resin Sealing Layer—

The organic electric field light-emitting element may be sealed with a resin sealing layer so as to prevent the organic electric field light-emitting element and functions thereof from deterioration due to oxygen or moisture in the atmosphere.

The material of the resin sealing layer is suitably selected depending on the intended purpose without any restriction, and examples thereof include acrylic resin, epoxy resin, fluororesin, silicone resin, rubber-based resin, and ester-based resin. Among them, the epoxy resin is particularly preferable in view of its desirable moisture proof properties. Among the epoxy resin, a thermocurring epoxy resin and photocurring epoxy resin are preferable.

The method for forming the resin sealing layer is suitably selected depending on the intended purpose without any restriction, and examples thereof include a method in which a resin solution is coated, a method in which a resin sheet is pressure bonded or thermally pressure bonded, and a method of dry polymerization through deposition, or sputtering.

(Layer Structure of Organic Electric Field Light-Emitting Element)

FIG. 1 is a schematic diagram showing one example of the layer structure of the organic electric field light-emitting element of the present invention. The organic electric field light-emitting element 10 contains an anode 2, a hole injection layer 3, a hole transporting layer 4, an organic layer 5, an electron transporting layer 6, an electron injection layer 7, and a cathode 8 formed and laminated on a substrate 1 in this order. The organic layer 5 contains a first organic layer 51, a second organic layer 52, and a third organic layer 53 laminated in this order from the side of the hole transporting layer 4. Note that, the anode 2 and the cathode 8 are electrically connected to each other through a power source.

Figure 2:
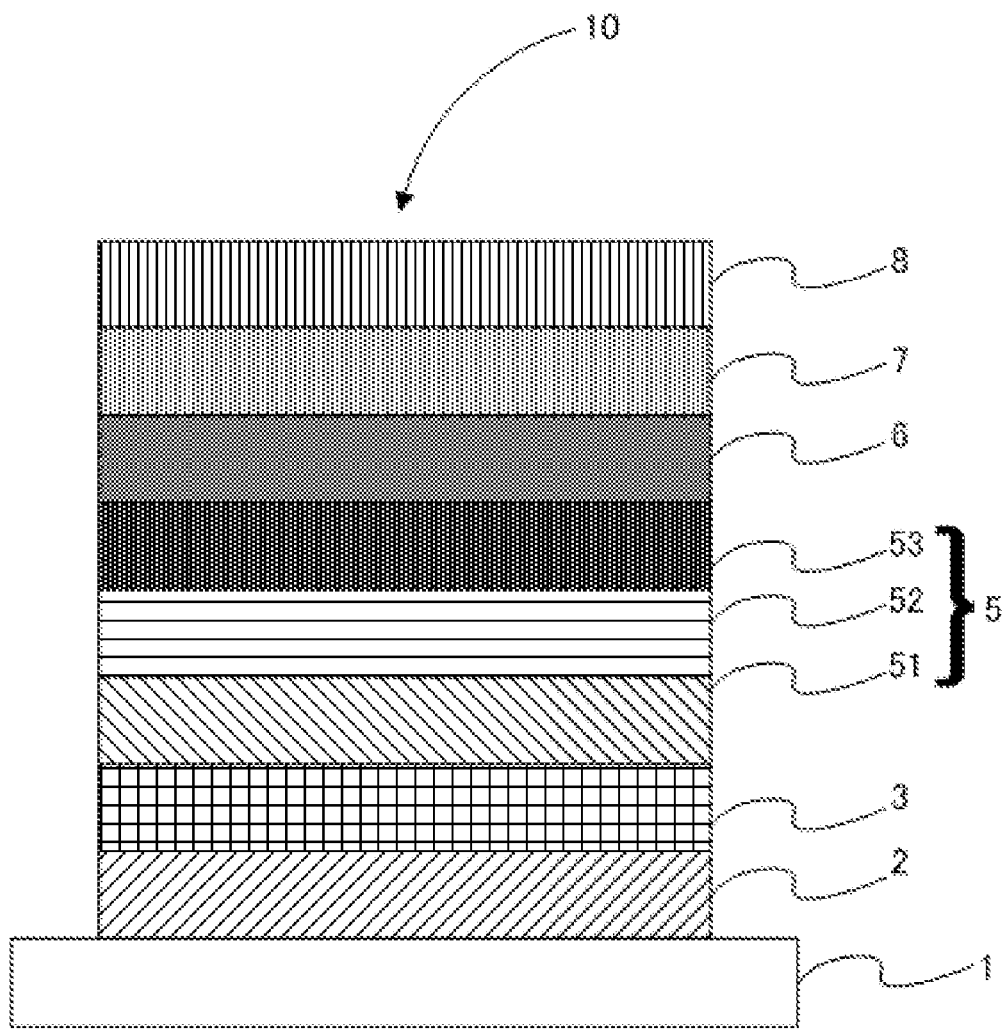
FIG. 2 is a schematic diagram showing one example of the layer structure of the organic electric field light-emitting element of the present invention.
Figure 3:
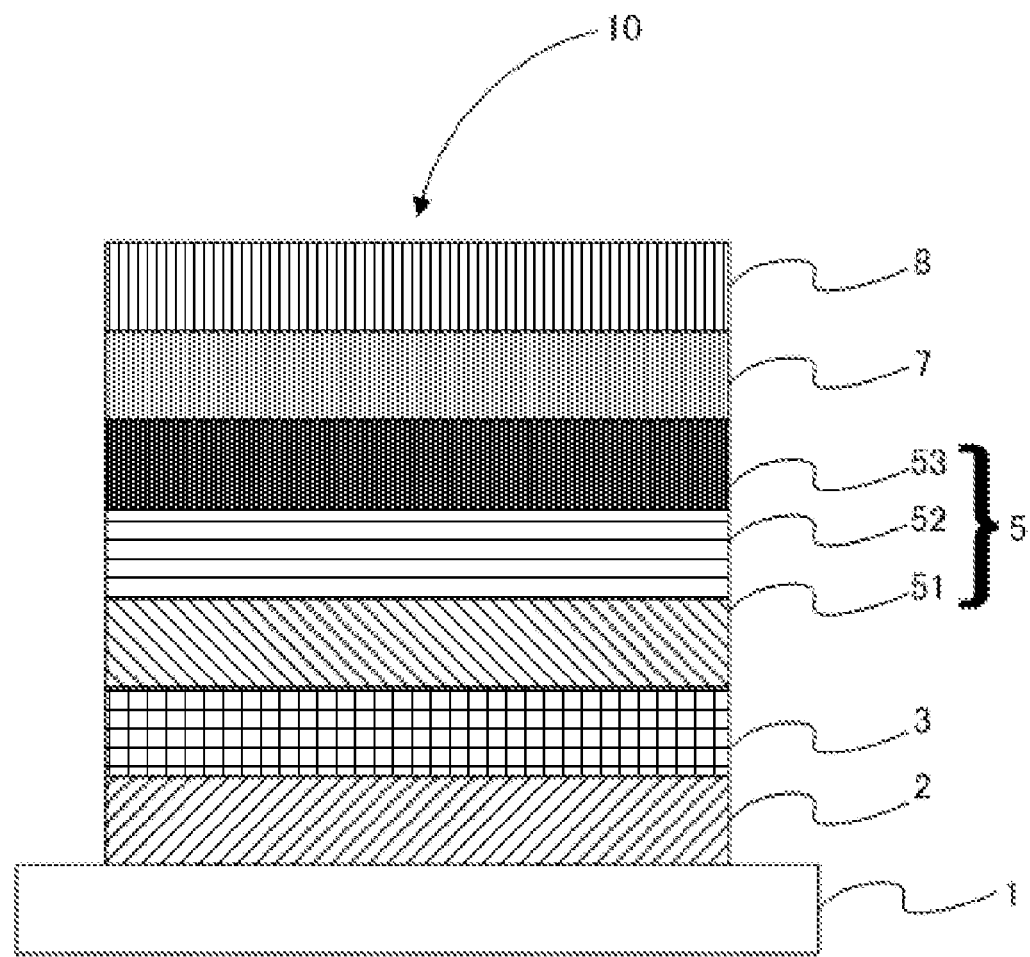
FIG. 3 is a schematic diagram showing one example of the layer structure of the organic electric field light-emitting element of the present invention.

Moreover, as FIG. 2 shows an example, the organic electric field light-emitting element of the present invention can be structured such that the anode 2 formed on the substrate 1, the hole injection layer 3, the first organic layer 51, the second organic layer 52, the third organic layer 53, the electron transporting layer 6, the electron injection layer 7, and the cathode 8 are laminated in this order. Furthermore, as FIG. 3 shows an example, it can be structured that the anode 2 formed on the substrate 1, the hole injection layer 3, the first organic layer 51, the second organic layer 52, the third organic layer 53, the electron injection layer 7, and the cathode 8 are laminated in this order.

(Use)

Use of the organic electric field light-emitting element is suitably selected depending on the intended purpose without any restriction, but it is suitably used for a display element, a display, a back light, electrophotography, a illumination light source, a recording light source, an exposure light source, a reading light source, an indicator, a signboard, interior decoration, and optical communication.

As a method of making the organic electroluminescence display full color, for example, as described in Monthly Display, pp. 33-37 (September, 2000), a three-color light-emitting method of arranging organic EL elements emitting lights corresponding to three primary colors (blue (B), green (G) and red (R)) of colors on a substrate, a white color method of separating white color emission by an organic EL element for white color emission to three colors through a color filter, and a color-converting method of converting blue color emission by an organic EL element for blue color emission to red (R) and green (G) through a fluorescent dye layer are known.

Moreover, the organic electric field light-emitting element of the present invention can attain intended emission color by combining a plurality of different emission colors obtained by the hole-transporting phosphorescent material or electron-trapping material. In the case where the organic electric field light-emitting element is for providing emission of blue, green, or red, the hole-transporting phosphorescent material or electron-trapping material having emission peak at around the intended wavelength can be added to the first organic layer and the second organic layer. Note that, when the hole-transporting phosphorescent material is used as a main source for emission, the triplet excitation level of the hole-transporting phosphorescent material can be made lower than the triplet excitation level of the electron-trapping material. When the electron-trapping material is used as a main source for emission, the triplet excitation level of the electron-trapping material can be made lower than the triplet excitation level of the hole-transporting phosphorescent material.

Furthermore, in the case where the organic electric field light-emitting element of the present invention is for emission of white, for example, a blue phosphorescent material having an emission peak at 420 nm to 500 nm can be used as the hole-transporting phosphorescent material, and a green luminescent material having an emission peak at 500 nm to 570 nm and a red luminescent material having an emission peak at 570 nm to 650 nm can be added to the first organic layer.

EXAMPLES

Examples of the present invention will be explained hereinafter, but these examples shall not be construed as limiting the scope of the present invention in any way.

In Examples below, thicknesses (film thicknesses) of a first organic layer, a second organic layer, and a third organic layer are average thicknesses each of which is an average value of values obtained by measuring at 10 points by a stylus surface profiler.

Example 1

<Preparation of Green Organic Electric Field Light-Emitting Element>

After placing a glass substrate having a thickness of 0.5 mm and a side of 2.5 cm in a wash container and washing in 2-propanol by ultrasonic cleaning, the glass substrate was subjected to UV-ozone treatment for 30 minutes. On this glass substrate, the following layers were deposited by vacuum deposition. Note that, in Examples and Comparative Examples below, the deposition rate was 0.2 nm/sec, unless otherwise stated. The deposition rate was measured by means of a crystal oscillator. Moreover, thicknesses of the following layers were measured by means of a crystal oscillator.

At first, as an anode, indium tin oxide (ITO) was provided on the glass substrate by sputtering to have a thickness of 70 nm.

Then, as a hole injection layer, the compound expressed by the following structural formula (Ir complex G-1) was deposited on the anode (ITO) to have a thickness of 10 nm.

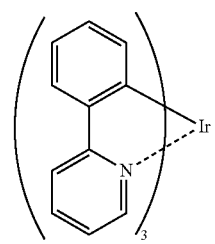

Ir complex G-1

On the hole injection layer, a first organic layer (serving as a hole transporting layer as well as a light emitting layer) having a thickness of 30 nm was formed by codepositing Compound 1 serving as a first host material and Ir complex G-1 serving as a first hole-transporting phosphorescent material so that the first organic layer contained Compound 1 in an amount of 85% by mass and Ir complex G-1 in an amount of 15% by mass both relative to the mass of the first organic layer.

Compound 1

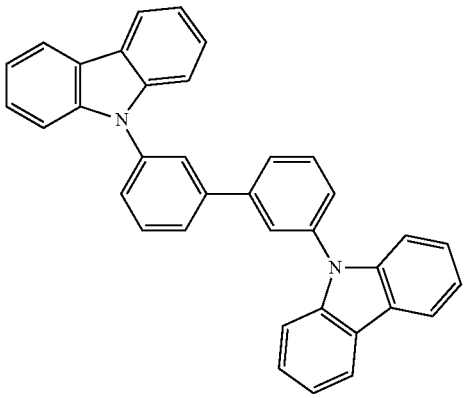

On the first organic layer, a second organic layer (serving as a light emitting layer) having a thickness of 30 nm was formed by codepositing Compound 1 as a second host material, Ir complex G-1 serving as a second hole-transporting phosphorescent material and the compound expressed by the following structural formula (Pt complex G-1) as an electron-trapping material so that the second organic layer contained Compound 1 in an amount of 84% by mass, Ir complex G-1 in an amount of 15% by mass and Pt complex G-1 in an amount of 1% by mass relative to the mass of the second organic layer.

Pt complex G-1

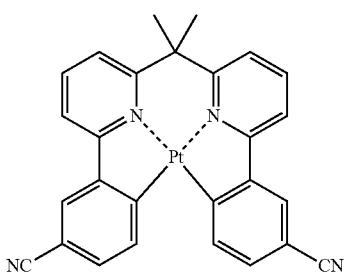

On the second organic layer, a third organic layer (serving as a hole-blocking layer) having a thickness of 5 nm was formed by sputtering Compound 2 expressed by the following structural formula.

Compound 2

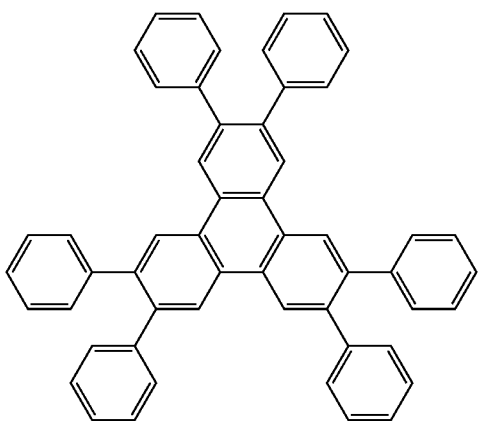

On the third organic layer, a tris(8-quinolinol)aluminum complex (Alq) was deposited as an electron transporting layer to have a thickness of 45 nm.

Thereafter, a mask which had been patterned to have the intended shape of a cathode (a mask having a emission region of 2 mm×2 mm) was placed on the electron transporting layer, and metallic aluminum was vacuum deposited through the mask to have a thickness of 100 nm.

The laminate obtained in such manner was placed in a glove compartment whose inner atmosphere had been replaced with argon gas, and the compartment was seeled with a stainless steel sealing can and a UV-curable adhesive (XNR5516HV, manufactured by Nagase ChemteX Corporation). In the manner described above, an organic electric field light-emitting element of Example 1 was prepared.

(Evaluation)

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the following manners.

<Driving Voltage>

The voltage was measured by means of a source measure unit 2400, manufactured by Keithley Instruments Inc. at the time when direct current was applied to the element.

<Measurement of External Quantum Efficiency>

The organic electric field light-emitting element was driven to emit light by applying direct current by means of a source measure unit 2400, manufactured by Keithley Instruments Inc. The luminance at the time of the emission was measured by means of Luminance Meter BM-8 manufactured by Topcon Corporation. The emission spectrum and emission wavelength were both measured by means of a spectrum analyzer PMA-11 manufactured by Hamamatsu Photonics K.K. Based on these measured values, the external quantum efficiency was calculated according to the luminance conversion method.

<Permanence>

The organic electric field light-emitting element was driven by applying constant current until the luminance was reduced to the half of the initial luminance 5,000 cd/m$^2$, and then the half-value period ($t_{5000}$) of the luminance was measured. Based on the half-value period of the luminance (5,000 cd/m$^2$), it was assumed that the 1.5 power law would be applied, and hence a half-value period of the luminance (1,000 cd/m$^2$) was calculated according to the following formula.

$$t_{1000}=t_{5000}\times(5,000\ cd/1,000\ cd)^{1.5}$$

<Chromaticity Change (Δ Chromaticity)>

The organic electric field light-emitting element was driven to emit light by applying direct current and a constant voltage by using a source measure unit 2400, manufactured by Toyo Corporation. A spectrum of the obtained emission was measured by using an optical emission spectrum analyzing system (ELS1500) manufactured by Shimadzu Corporation, and based on the obtained spectrum x value and y value were calculated according to CIE color system. The chromaticity change (Δ chromaticity) was calculated according to the formula presented below, based on the deviation of the x value and y value (Δx, Δy) when the current density was changed from 0.1 mA/cm$^2$ to 10 mA/cm$^2$.

$$\Delta Chromaticity=(\Delta y^2+\Delta x^2)^{0.5}$$

<Triplet Level (T1) of Hole-Blocking Layer>

An organic film having a thickness of 50 nm was formed on a quartz substrate by vacuum deposition. The organic film was cooled to 77 K, and a fluorescence spectrum thereof was obtained by means of Spectrofluorophotometer RF-5300PC manufactured by Shimadzu Corporation. The triplet level was calculated from the value at the shortest wavelength of the phosphorescence component spectrum within the fluorescence spectrum obtained at 77 K.

<Triplet Level (T1) of Hole-Transporting Phosphorescent Material>

An organic film having a thickness of 50 nm was formed on a quartz substrate by codepositing mCP and 10% by mass of a phosphorescent material relative to the mass of mCP by vacuum deposition. A fluorescence spectrum of the obtained organic film was obtained at room temperature by means of Spectrofluorophotometer RF-5300PC manufactured by Shimadzu Corporation. The triplet level was calculated from the value at the shortest wavelength of the phosphorescence component spectrum within the fluorescence spectrum.

Example 2

<Preparation of Green Organic Electric Field Light-Emitting Element>

An organic electric field light-emitting element of Example 2 was prepared in the same manner as in Example 1, provided that the first organic layer was changed to contain 84% by mass of Compound 1, 15% by mass of Ir complex G-1, and 1% by mass of Pt complex G-1 as the electron-trapping material, relative to the mass of the first organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 3

<Preparation of Green Organic Electric Field Light-Emitting Element>

An organic electric field light-emitting element of Example 3 was prepared in the same manner as in Example 2, provided that in the first organic layer the amount of Compound 1, the amount of Ir complex G-1 and the amount of Pt complex G-1 were respectively changed to 82% by mass, 15% by mass, and 3% by mass relative to the mass of the first organic layer, and in the second organic layer the amount of Compound 1, the amount of Ir complex G-1 and the amount of Pt complex G-1 were respectively changed to 82% by mass, 15% by mass, and 3% by mass relative to the mass of the second organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent, material in the same manner as in Example 1.

Comparative Example 1

<Preparation of Green Organic Electric Field Light-Emitting Element>

An organic electric field light-emitting element of Comparative Example 1 was prepared in the same manner as in Example 1, provided that Pt complex G-1 was not added to the second organic layer and the amount of Compound 1 in the second organic layer was changed to 85% by mass.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 2

<Preparation of Green Organic Electric Field Light-Emitting Element>

An organic electric field light-emitting element of Comparative Example 2 was prepared in the same manner as in Example 1, provided that the electron-trapping material of the second organic layer was changed from Pt complex G-1 to Ir complex G-2 expressed by the following structural formula.

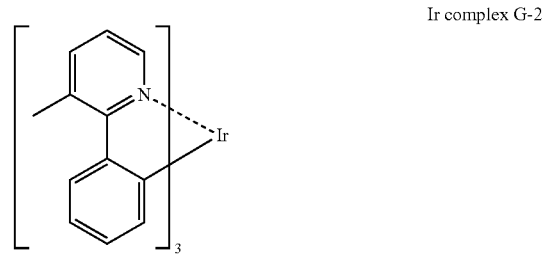

Ir complex G-2

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 3

<Preparation of Green Organic Electric Field Light-Emitting Element>

An organic electric field light-emitting element of Comparative Example 3 was prepared in the same manner as in Example 2, provided that the electron-trapping material of the first and second organic layers was changed from Pt complex G-1 to Ir complex G-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 4

<Preparation of Green Organic Electric Field Light-Emitting Element>

An organic electric field light-emitting element of Comparative Example 4 was prepared in the same manner as in Example 3, provided that the electron-trapping material of the first and second organic layer was changed from Pt complex G-1 to Ir complex G-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 5

<Preparation of Green Organic Electric Field Light-Emitting Element>

An organic electric field light-emitting element of Comparative Example 5 was prepared in the same manner as in Example 2, provided that the amount of the electron-trapping material in the first organic layer and that in the second organic layer were both changed from 1% by mass to 10% by mass, and the amount of Compound 1 in the first organic layer and that in the second organic layer were both changed from 84% by mass to 75% by mass.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 4

<Preparation of Green Organic Electric Field Light-Emitting Element>

An organic electric field light-emitting element of Example 4 was prepared in the same manner as in Example 3, provided that the electron-trapping material of the first and second organic layers was changed from Pt complex G-1 to Compound 3 expressed by the following structural formula.

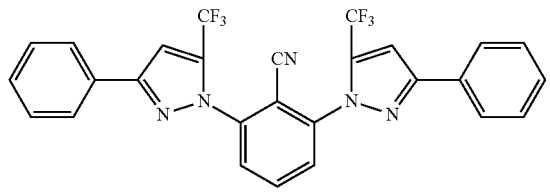

Compound 3

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 6

<Preparation of Green Organic Electric Field Light-Emitting Element>

An organic electric field light-emitting element of Comparative Example 6 was prepared in the same manner as in Example 3, provided that the thickness of the first organic layer and the thickness of the second organic layer were both changed from 30 nm to 15 nm.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 7

<Preparation of Green Organic Electric Field Light-Emitting Element>

An organic electric field light-emitting element of Comparative Example 7 was prepared in the same manner as in Comparative Example 1, provided that the formulation of the first organic layer was changed to 100% by mass of α-NPD (bis[N-(1-naphthyl)-N-phenyl]benzidine).

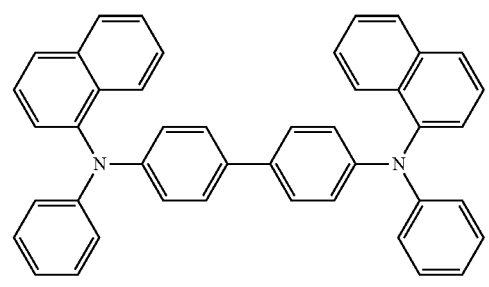

α-NPD

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

The results of the calculations of HOMO level and LUMO level of the materials used for Examples 1 to 4 and Comparative Examples 1 to 7, as well as the measurement results of the triplet level (T1) thereof are shown in Table 1. Note that, HOMO level and LUMO level are both calculation values, which are calculated by using a software for calculating molecular orbital, Gaussian 03, manufactured by Gaussian, Inc. (Gaussian 03, Revision D.02, M. J. Frisch, et. al., Gaussian, Inc., Wallingford Conn., 2004.) and obtained by structurally optimizing using B3LYP/6-31G* as a keyword.

TABLE 1

|  | HOMO [eV] | LUMO [eV] | Triplet (T1) [eV] |
|---|---|---|---|
| Compound 1 | −5.39 | −1.17 | — |
| Ir complex G-1 | −4.85 | −1.19 | 2.52 |
| Pt complex G-1 | −6.6 | −2.32 | — |
| Ir complex G-2 | −4.76 | −1.1 | — |
| Compound 2 | −5.54 | −1.29 | 2.62 |
| Compound 3 | −6.25 | −2.02 | — |

The evaluation results (driving voltage, external quantum efficiency, permanence, and chromaticity change) and structures of the organic electric field light-emitting elements prepared Examples 1 to 4 and Comparative Examples 1 to 7 are shown in Tables 2 and 3.

TABLE 2

|  |  | Ex. 1 | Ex. 2 | Ex. 3 | Comp. Ex. 1 | Comp. Ex. 2 | Comp. Ex. 3 | Comp. Ex. 4 | Comp. Ex. 5 |
|---|---|---|---|---|---|---|---|---|---|
| Hole injection layer (10 nm) | | Ir G-1 | Ir G-1 | Ir G-1 | Ir G-1 | Ir G-1 | Ir G-1 | Ir G-1 | Ir G-1 |
| $1^{st}$ organic layer | $1^{st}$ host (wt %) | C1 (85 wt %) | C1 (84 wt %) | C1 (82 wt %) | C1 (85 wt %) | C1 (85 wt %) | C1 (84 wt %) | C1 (82 wt %) | C1 (75 wt %) |
| | $1^{st}$ phosphorescent (wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) |
| | $1^{st}$ trap (mass %) | | Pt G-1 (1 wt %) | Pt G-1 (3 wt %) | | | Ir G-2 (1 wt %) | Ir G-2 (3 wt %) | Pt G-1 (10 wt %) |
| | Thickness [nm] | 30 | 30 | 30 | 30 | 30 | 30 | 30 | 30 |
| $2^{nd}$ organic layer | $2^{nd}$ host (wt %) | C1 (84 wt %) | C1 (84 wt %) | C1 (82 wt %) | C1 (85 wt %) | C1 (84 wt %) | C1 (84 wt %) | C1 (82 wt %) | C1 (75 wt %) |
| | $2^{nd}$ phosphorescent (wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) |
| | $2^{nd}$ trap (mass %) | Pt G-1 (1 wt %) | Pt G-1 (1 wt %) | Pt G-1 (3 wt %) | | Ir G-2 (1 wt %) | Ir G-2 (1 wt %) | Ir G-2 (3 wt %) | Pt G-1 (10 wt %) |
| | Thickness [nm] | 30 | 30 | 30 | 30 | 30 | 30 | 30 | 30 |
| Third organic layer (5 nm) | | C2 | C2 | C2 | C2 | C2 | C2 | C2 | C2 |
| Electron transporting layer (45 nm) | | Alq | Alq | Alq | Alq | Alq | Alq | Alq | Alq |
| Voltage [V] | | 8.8 | 8.8 | 8.0 | V8.8 | 8.8 | 8.8 | 8.8 | 8.5 |
| EOE [%] | | 15.6 | 15.6 | 15.5 | 14.3 | 14.3 | 14.3 | 14.3 | 12.5 |
| Permanence [h] | | 4,400 | 4,600 | 4,400 | 2,600 | 2,600 | 2,200 | 2,200 | 4,000 |
| CIE chromaticity (x, y) | | 0.34, 0.62 | 0.34, 0.62 | 0.33, 0.62 | 0.33, 0.62 | 0.33, 0.62 | 0.34, 0.62 | 0.34, 0.62 | 0.33, 0.62 |
| ΔChromaticity | | 0.007 | 0.007 | 0.011 | 0.023 | 0.023 | 0.023 | 0.023 | 0.018 |

In Table 2, "$1^{st}$ host" denotes a first host material, "$1^{st}$ phosphorescent" denotes a first hole-transporting phosphorescent material, "$1^{st}$ trap" denotes an electron-trapping material contained in the first organic layer, "$2^{nd}$ host" denotes a second host material, "$2^{nd}$ phosphorescent" denotes a second hole-transporting phosphorescent material, "$2^{nd}$ trap" denotes an electron-trapping material contained in the second organic layer, "Ir G-1" "Ir G-2" and "Pt G-1" respectively denote Ir complex G-1, Ir complex G-2, and Pt complex G-1, and "C 1" and "C 2" respectively denote Compound 1 and Compound 2. Moreover, in terms of the evaluations, the voltage, the external quantum efficiency (EQE), permanence, and CIE chromaticity (x, y) are all values at the luminance of 1,000 Cd/m².

TABLE 3

|  |  | Ex. 4 | Comp. Ex. 6 | Comp. Ex. 7 |
|---|---|---|---|---|
| Hole injection layer (10 nm) | | Ir G-1 | Ir G-1 | Ir G-1 |
| $1^{st}$ organic layer | $1^{st}$ host (wt %) | C 1 (82 wt %) | C 1 (84 wt %) | NPD |
| | $1^{st}$ phosphorescent (wt %) | Ir G-1 (15 wt %) | Ir G-1 (15 wt %) | |
| | $1^{st}$ trap (mass %) | C 3 (3 wt %) | Pt G-1 (1 wt %) | |
| | Thickness [nm] | 30 | 15 | 30 |
| $2^{nd}$ organic layer | $2^{nd}$ host (wt %) | C 1 (82 wt %) | C 1 (84 wt %) | C 1 (85 wt %) |
| | $2^{nd}$ phosphorescent (wt %) | Ir G-1 (15 wt %) | Ir G-1 (15 wt %) | Ir G-1 (15 wt %) |
| | $2^{nd}$ trap (mass %) | C 3 (3 wt %) | Pt G-1 (1 wt %) | |
| | Thickness [nm] | 30 | 15 | 30 |
| Third organic layer (5 nm) | | C 2 | C 2 | C 2 |
| Electron transporting layer (45 nm) | | Alq | Alq | Alq |
| Voltage [V] | | 8.8 | 7.5 | 8.0 |
| EOE [%] | | 15.0 | 12.3 | 13.1 |
| Permanence [h] | | 2,600 | 1,500 | 2,000 |
| CIE (x, y) | | 0.33, 0.62 | 0.34, 0.62 | 0.34, 0.62 |
| ΔChromaticity | | 0.014 | 0.021 | 0.013 |

In Table 3, "$1^{st}$ host" denotes a first host material, "$1^{st}$ phosphorescent" denotes a first hole-transporting phosphorescent material, "$1^{st}$ trap" denotes an electron-trapping material contained in the first organic layer, "$2^{nd}$ host" denotes a second host material, "$2^{nd}$ phosphorescent" denotes a second hole-transporting phosphorescent material, "$2^{nd}$ trap" denotes an electron-trapping material contained in the second organic layer, "Ir G-1" and "Pt G-1" respectively denote Ir complex G-1 and Pt complex G-1, and "C 1", "C 2" and "C 3" respectively denote Compound 1, Compound 2 and Compound 3. Moreover, in terms of the evaluations, the voltage, the external quantum efficiency (EQE), permanence, and CIE chromaticity (x, y) are all values at the luminance of 1,000 cd/m².

Compared to the results of Comparative Example 7 (JP-B No. 3,929,689), Comparative Example 1 (International Application Publication No. WO 2009/030981) had higher efficiency and longer permanence, but had a problem that it had the larger deviation in the chromaticity due to the change in the value of electricity. Examples 1 to 4 realized all of the improvement of efficiency and permanence, and suppression of the deviation in the chromaticity due to the change in the value for electricity, compared to the results of Comparative Example 1. It is assumed that the aforementioned effect is attained because the addition of the electron-trapping material presents the emission location from moving or sifting. Moreover, compared to the results of Comparative Examples 2 to 4 in which the electron-trapping material was changed to Ir complex G-2 having the lower LUMO level, Examples 1 to 4 were excellent in the efficiency, permanence, suppression of chromaticity deviation due to the change in the value of electricity.

Furthermore, it was found that Comparative Example 6 having the thinner first organic layer and second organic layer (both 15 nm) had inferior efficiency and permanence as well as larger chromaticity deviation due to the change in the value of electricity, compared to the results of Examples 1 to 4.

Example 5

<Preparation of Green Organic Electric Field Light-Emitting Element>

An organic electric field light-emitting element of Example 5 was prepared in the same manner as in Example 1, provided that the amount of the first hole-transporting phosphorescent material in the first organic layer was changed to 30% by mass, and the electron-trapping material of the second organic layer was changed from Pt complex G-1 to Pt complex G-2 expressed by the following structural formula.

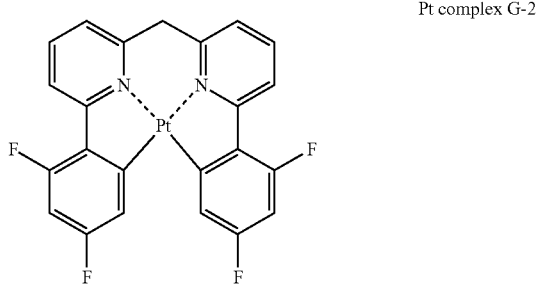

Pt complex G-2

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 6

<Preparation of Green Organic Electric Field Light-Emitting Element>

An organic electric field light-emitting element of Example 6 was prepared in the same manner as in Example 5, provided that the first organic layer was changed to contain 69% by mass of Compound 1, 30% by mass of Ir complex G-1, and 1% by mass of Pt complex G-2 serving as the electron-trapping material, relative to the mass of the first organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 7

<Preparation of Green Organic Electric Field Light-Emitting Element>

An organic electric field light-emitting element of Example 7 was prepared in the same manner as in Example 6, provided that in the first organic layer the amount of Compound 1, the amount of Ir complex G-1 and the amount of Pt complex G-2 were respectively changed to 67% by mass, 30% by mass, and 3% by mass relative to the mass of the first organic layer, and in the second organic layer the amount of Compound 1, the amount of Ir complex G-1, and the amount of Pt complex G-2 were respectively changed to 82% by mass, 15% by mass, and 3% by mass, relative to the mass of the second organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 8

<Preparation of Green Organic Electric Field Light-Emitting Element>

An organic electric field light-emitting element of Comparative Example 8 was prepared in the same manner as in Example 5, provided that Pt complex G-2 was not added to the second organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 9

<Preparation of Green Organic Electric Field Light-Emitting Element>

An organic electric field light-emitting element of Comparative Example 9 was prepared in the same manner as in Example 5, provided that the electron-trapping material of the second organic layer was changed from Pt complex G-2 to Ir complex G-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 10

<Preparation of Green Organic Electric Field Light-Emitting Element>

An organic electric field light-emitting element of Comparative Example 10 was prepared in the same manner as in Example 6, provided that the electron-trapping material of the first and second organic layers was changed from Pt complex G-2 to Ir complex G-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 11

<Preparation of Green Organic Electric Field Light-Emitting Element>

An organic electric field light-emitting element of Comparative Example 11 was prepared in the same manner as in Example 7, provided that the electron-trapping material of the first and second organic layers was changed from Pt complex G-2 to Ir complex G-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 12

<Preparation of Green Organic Electric Field Light-Emitting Element>

An organic electric field light-emitting element of Comparative Example 12 was prepared in the same manner as in Example 6, provided that in the first and second organic layers the amount of the electron-trapping material was changed from 1% by mass to 10% by mass, and the amount of Compound 1 was changed from 69% by mass to 60% by mass.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 13

<Preparation of Green Organic Electric Field Light-Emitting Element>

An organic electric field light-emitting element of Comparative Example 13 was prepared in the same manner as in Example 6, provided that the thickness of the first organic layer, and the thickness of the second organic layer were both changed from 30 nm to 15 nm.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

The results of the calculations of HOMO level and LUMO level of the materials used for Examples 5 to 7 and Comparative Examples 8 to 13, as well as the measurement results of the triplet level (T1) thereof are shown in Table 4. Note that, HOMO level and LUMO level are both calculation values, which are calculated by using a software for calculating molecular orbital, Gaussian 03, manufactured by Gaussian, Inc. (Gaussian 03, Revision D.02, M. J. Frisch, et. al., Gaussian, Inc., Wallingford Conn., 2004.) and obtained by structurally optimizing using B3LYP/6-31G* as a keyword.

TABLE 4

|  | HOMO [eV] | LUMO [eV] | Triplet (T1) [eV] |
|---|---|---|---|
| Compound 1 | −5.39 | −1.17 | — |
| Ir complex G-1 | −4.85 | −1.19 | 2.52 |
| Pt complex G-2 | −5.67 | −1.9 | — |
| Ir complex G-2 | −4.76 | −1.1 | — |
| Compound 2 | −5.54 | −1.29 | 2.62 |

The evaluation results (driving voltage, external quantum efficiency, permanence, and deviation in chromaticity) and structures of the organic electric field light-emitting elements prepared Examples 5 to 7 and Comparative Examples 8 to 13 are shown in Table 5.

TABLE 5

|  |  | Ex. 5 | Ex. 6 | Ex. 7 | Comp. Ex. 8 | Comp. Ex. 9 | Comp. Ex. 10 | Comp. Ex. 11 | Comp. Ex. 12 | Comp. Ex. 13 |
|---|---|---|---|---|---|---|---|---|---|---|
| Hole injection layer (10 nm) |  | Ir G-1 | Ir G-1 | Ir G-1 | Ir G-1 | Ir G-1 | Ir G-1 | Ir G-1 | Ir G-1 | Ir G-1 |
| 1st organic layer | 1st host (wt %) | C1 (70 wt %) | C1 (69 wt %) | C1 (67 wt %) | C1 (70 wt %) | C1 (70 wt %) | C1 (69 wt %) | C1 (67 wt %) | C1 (60 wt %) | C1 (69 wt %) |
|  | 1st phosphorescent (wt %) | Ir G-1 (30 wt %) | Ir G-1 (30 wt %) | Ir G-1 (30 wt %) | Ir G-1 (30 wt %) | Ir G-1 (30 wt %) | Ir G-1 (30 wt %) | Ir G-1 (30 wt %) | Ir G-1 (30 wt %) | Ir G-1 (30 wt %) |
|  | 1st trap (mass %) |  | Pt G-2 (1 wt %) | Pt G-2 (3 wt %) |  |  | Ir G-2 (1 wt %) | Ir G-2 (3 wt %) | Ir G-2 (10 wt %) | Pt G-2 (1 wt %) |
|  | Thickness [nm] | 30 | 30 | 30 | 30 | 30 | 30 | 30 | 30 | 15 |
| 2nd organic layer | 2nd host (wt %) | C1 (84 wt %) | C1 (84 wt %) | C1 (82 wt %) | C1 (85 wt %) | C1 (84 wt %) | C1 (84 wt %) | C1 (82 wt %) | C1 (75 wt %) | C1 (84 wt %) |
|  | 2nd phosphorescent (wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) | Ir G-1 (15 wt %) |
|  | 2nd trap (mass %) | Pt G-2 (1 wt %) | Pt G-2 (1 wt %) | Pt G-2 (3 wt %) |  | Ir G-2 (1 wt %) | Ir G-2 (1 wt %) | Ir G-2 (3 wt %) | Pt G-2 (10 wt %) | Pt G-2 (1 wt %) |
|  | Thickness [nm] | 30 | 30 | 30 | 30 | 30 | 30 | 30 | 30 | 15 |
| Third organic layer (5 nm) |  | C2 | C2 | C2 | C2 | C2 | C2 | C2 | C2 | C2 |
| Electron transporting layer (45 nm) |  | Alq | Alq | Alq | Alq | Alq | Alq | Alq | Alq | Alq |
| Voltage [V] |  | 8.3 | 8.3 | 8.4 | 8.2 | 8.2 | 8.2 | 8.2 | 8.2 | 7.0 |
| EQE [%] |  | 16.4 | 16.4 | 15.5 | 15.6 | 15.6 | 15.5 | 15.4 | 14.5 | 13.0 |
| Permanence [h] |  | 4,400 | 4,600 | 4,400 | 2,700 | 2,700 | 2,600 | 2,700 | 4,000 | 1,800 |
| CIE (x, y) |  | 0.34, 0.62 | 0.34, 0.62 | 0.33, 0.62 | 0.33, 0.62 | 0.33, 0.62 | 0.34, 0.62 | 0.34, 0.62 | 0.33, 0.62 | 0.34, 0.62 |
| ΔChromaticity |  | 0.010 | 0.011 | 0.014 | 0.028 | 0.028 | 0.028 | 0.028 | 0.025 | 0.020 |

In Table 5, "1st host" denotes a first host material, "1st phosphorescent" denotes a first hole-transporting phosphorescent material, "1st trap" denotes an electron-trapping material contained in the first organic layer, "2nd host" denotes a second host material, "2nd phosphorescent" denotes a second hole-transporting phosphorescent material, "2nd trap" denotes an electron-trapping material contained in the second organic layer, "Ir G-1," "Ir G-2" and "Pt G-2" respectively denote Ir complex G-1, Ir complex G-2, and Pt complex G-2, and "C 1" and "C 2" respectively denote Compound 1 and Compound 2. Moreover, in terms of the evaluations, the voltage, the external quantum efficiency (EQE), permanence, and CIE chromaticity (x, y) are all values at the luminance of 1,000 cd/m².

Examples 5 to 7 realized all of the improvement of efficiency and permanence, and suppression of the deviation in the chromaticity due to the change in the value for electricity, compared to the results of Comparative Example 8. It is assumed that the aforementioned effect is attained because the addition of the electron-trapping material presents the emission location from moving or sifting. Moreover, compared to the results of Comparative Examples 9 to 11 in which the electron-trapping material was changed to Ir complex G-2 having the lower LUMO level, Examples 5 to 7 were excellent in the efficiency, permanence, suppression of chromaticity deviation due to the change in the value of electricity.

Furthermore, it was found that Comparative Example 13 having the thinner first organic layer and second organic layer (both 15 nm) had inferior efficiency and permanence as well as larger chromaticity deviation due to the change in the value of electricity, compared to the results of Examples 5 to 7.

Example 8

<Preparation of Blue Organic Electric Field Light-Emitting Element>

An organic electric field light-emitting element of Example 8 was prepared in the same manner as in Example 1, provided that the material of the hole injection layer was changed from Ir complex G-1 to $MoO_3$, the first hole-transporting phosphorescent material and the second hole-transporting phosphorescent material were both changed from Ir complex G-1 to Ir complex B-1 expressed by the following structural formula, the electron-trapping material of the second organic layer was changed from Pt complex G-1 to Pt complex B-1 expressed by the following structural formula, and the material of the third organic layer was changed from Compound 2 to Compound 1.

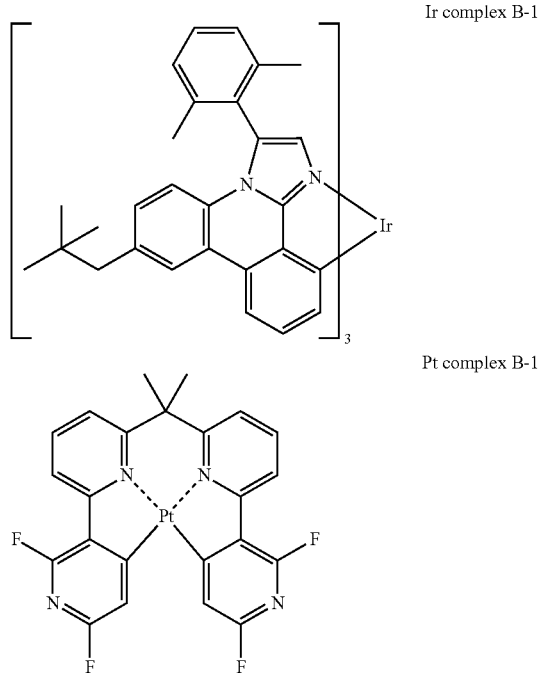

Ir complex B-1

Pt complex B-1

The prepared organic electric field light-emitting element was evaluated in terms of its driving voltage, external quantum efficiency, permanence, chromaticity change (Δ chromaticity), triplet level (T1) of the hole-blocking material, and triplet is level (T1) of the hole-transporting phosphorescent material in the same manner as in Example 1.

Example 9

<Preparation of Blue Organic Electric Field Light-Emitting Element>

An organic electric field light-emitting element of Example 9 was prepared in the same manner as in Example 8, provided that the first organic layer was changed to contain 84% by mass of Compound 1, 15% by mass of Ir complex B-1, and 1% by mass of Pt complex B-1 serving as the electron-trapping material, relative to the mass of the first organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 10

<Preparation of Blue Organic Electric Field Light-Emitting Element>

An organic electric field light-emitting element of Example 10 was prepared in the same manner as in Example 9, provided that in the first organic layer the amount of Compound 1, the amount of Ir complex B-1, and the amount of Pt complex B-1 were respectively changed to 82% by mass, 15% by mass, and 3% by mass relative to the mass of the first organic layer, and in the second organic layer the amount of Compound 1, the amount of Ir complex B-1 and the amount of Pt complex B-1 were respectively changed to 82% by mass, 15% by mass, and 3% by mass relative to the mass of the second organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 14

<Preparation of Blue Organic Electric Field Light-Emitting Element>

An organic electric field light-emitting element of Comparative Example 14 was prepared in the same manner as in Example 8, provided that Pt complex B-1 was not added to the second organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 15

<Preparation of Blue Organic Electric Field Light-Emitting Element>

An organic electric field light-emitting element of Comparative Example 15 was prepared in the same manner as in Example 9, provided that the electron-trapping material of the second organic layer was changed from Pt complex B-1 to Ir complex B-2 expressed by the following structural formula.

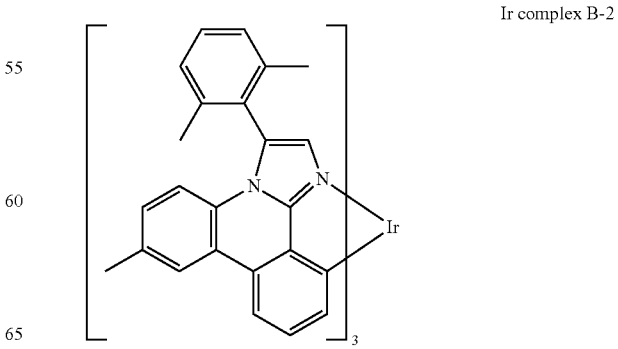

Ir complex B-2

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 16

<Preparation of Blue Organic Electric Field Light-Emitting Element>

An organic electric field light-emitting element of Comparative Example 16 was prepared in the same manner as in Example 9, provided that the electron-trapping material of the first and second organic layers was changed from Pt complex B-1 to Ir complex B-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 17

<Preparation of Blue Organic Electric Field Light-Emitting Element>

An organic electric field light-emitting element of Comparative Example 17 was prepared in the same manner as in Example 10, provided that the electron-trapping material of the first and second organic layers was changed from Pt complex B-1 to Ir complex B-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 18

<Preparation of Blue Organic Electric Field Light-Emitting Element>

An organic electric field light-emitting element of Comparative Example 18 was prepared in the same manner as in Example 9, provided that the amount of the electron-trapping material of the first organic layer and the electron-trapping material of the second organic layer were both changed from 1% by mass to 10% by mass, and the amount of Compound 1 contained in the first and second organic layers was changed from 84% by mass to 75% by mass.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 19

<Preparation of Blue Organic Electric Field Light-Emitting Element>

An organic electric field light-emitting element of Comparative Example 19 was prepared in the same manner as in Example 9, provided that the thickness of the first organic layer and the thickness of the second organic layer were both changed from 30 nm to 15 nm.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

The results of the calculations of HOMO level and LUMO level of the materials used for Examples 8 to 10 and Comparative Examples 14 to 19, as well as the measurement results of the triplet level (T1) thereof are shown in Table 6. Note that, HOMO level and LUMO level are both calculation values, which are calculated by using a software for calculating molecular orbital, Gaussian 03, manufactured by Gaussian, Inc. (Gaussian 03, Revision D.02, M. J. Frisch, et. al., Gaussian, Inc., Wallingford Conn., 2004.) and obtained by structurally optimizing using B3LYP/6-31G* as a keyword.

TABLE 6

|  | HOMO [eV] | LUMO [eV] | Triplet (T1) [eV] |
| --- | --- | --- | --- |
| Compound 1 | −5.39 | −1.17 | 2.86 |
| Ir complex B-1 | −4.57 | −0.77 | 2.75 |
| Pt complex B-1 | −6.26 | −2.25 | — |
| Ir complex B-2 | −4.55 | −0.76 | — |
| Pt complex B-2 | −6.08 | −2.26 | 2.82 |

The evaluation results (driving voltage, external quantum efficiency, permanence, and deviation in chromaticity) and structures of the organic electric field light-emitting elements prepared Examples 8 to 10 and Comparative Examples 14 to 19 are shown in Table 7.

TABLE 7

|  |  | Ex. 8 | Ex. 9 | Ex. 10 | Comp. Ex. 14 | Comp. Ex. 15 | Comp. Ex. 16 | Comp. Ex. 17 | Comp. Ex. 18 | Comp. Ex. 19 |
| --- | --- | --- | --- | --- | --- | --- | --- | --- | --- | --- |
| Hole injection layer (10 nm) |  | MoO$_3$ | MoO$_3$ | MoO$_3$ | MoO$_3$ | MoO$_3$ | MoO$_3$ | MoO$_3$ | MoO$_3$ | MoO$_3$ |
| 1$^{st}$ organic layer | 1$^{st}$ host (wt %) | C1 (85 wt %) | C1 (84 wt %) | C1 (82 wt %) | C1 (85 wt %) | C1 (85 wt %) | C1 (84 wt %) | C1 (82 wt %) | C1 (75 wt %) | C1 (84 wt %) |
|  | 1$^{st}$ phosphorescent (wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) |
|  | 1$^{st}$ trap (mass %) |  | Pt B-1 (1 wt %) | Pt B-1 (3 wt %) |  |  | Ir B-2 (1 wt %) | Ir B-2 (3 wt %) | Pt B-1 (10 wt %) | Pt B-1 (1 wt %) |
|  | Thickness [nm] | 30 | 30 | 30 | 30 | 30 | 30 | 30 | 30 | 15 |
| 2$^{nd}$ organic layer | 2$^{nd}$ host (wt %) | C1 (84 wt %) | C1 (84 wt %) | C1 (82 wt %) | C1 (85 wt %) | C1 (84 wt %) | C1 (84 wt %) | C1 (82 wt %) | C1 (75 wt %) | C1 (84 wt %) |
|  | 2$^{nd}$ phosphorescent (wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) |

TABLE 7-continued

|  | Ex. 8 | Ex. 9 | Ex. 10 | Comp. Ex. 14 | Comp. Ex. 15 | Comp. Ex. 16 | Comp. Ex. 17 | Comp. Ex. 18 | Comp. Ex. 19 |
|---|---|---|---|---|---|---|---|---|---|
| 2$^{nd}$ trap (mass %) | Pt B-1 (1 wt %) | Pt B-1 (1 wt %) | Pt B-1 (3 wt %) |  | Ir B-2 (1 wt %) | Ir B-2 (1 wt %) | Ir B-2 (3 wt %) | Pt B-1 (10 wt %) | Pt B-1 (1 wt %) |
| Thickness [nm] | 30 | 30 | 30 | 30 | 30 | 30 | 30 | 30 | 15 |
| Third organic layer (5 nm) | C1 | C1 | C1 | C1 | C1 | C1 | C1 | C1 | C1 |
| Electron transporting layer (45 nm) | Alq | Alq | Alq | Alq | Alq | Alq | Alq | Alq | Alq |
| Voltage [V] | 8.5 | 8.5 | 8.5 | 8.5 | 8.5 | 8.5 | 8.4 | 7.8 | 7.2 |
| EOE [%] | 9.5 | 11.5 | 11.4 | 8.1 | 8.1 | 8.1 | 8.1 | 10.0 | 7.5 |
| Permanence [h] | 600 | 630 | 620 | 420 | 430 | 430 | 430 | 460 | 360 |
| CIE (x, y) | 0.15, 0.27 | 0.15, 0.27 | 0.15, 0.27 | 0.15, 0.27 | 0.15, 0.27 | 0.15, 0.27 | 0.15, 0.27 | 0.15, 0.27 | 0.15, 0.27 |
| ΔChromaticity | 0.007 | 0.006 | 0.011 | 0.025 | 0.025 | 0.025 | 0.025 | 0.017 | 0.016 |

In Table 7, "1$^{st}$ host" denotes a first host material, "1$^{st}$ phosphorescent" denotes a first hole-transporting phosphorescent material, "1$^{st}$ trap" denotes an electron-trapping material contained in the first organic layer, "2$^{nd}$ host" denotes a second host material, "2$^{nd}$ phosphorescent" denotes a second hole-transporting phosphorescent material, "2$^{nd}$ trap" denotes an electron-trapping material contained in the second organic layer, "Ir B-1" "Ir B-2" and "Pt B-1" respectively denote Ir complex B-1, Ir complex B-2, and Pt complex B-1, and "C 1" denotes Compound 1. Moreover, in terms of the evaluations, the voltage, the external quantum efficiency (EQE), permanence, and CIE chromaticity (x, y) are all values at the luminance of 1,000 cd/m².

Examples 8 to 10 realized all of the improvement of efficiency and permanence, and suppression of the deviation in the chromaticity due to the change in the value for electricity, compared to the results of Comparative Example 14. It is assumed that the aforementioned effect is attained because the addition of the electron-trapping material presents the emission location from moving or sifting. Moreover, compared to the results of Comparative Examples 15 to 17 in which the electron-trapping material was changed to Ir complex B-2 having the lower LUMO level, Examples 8 to 10 were excellent in the efficiency, permanence, suppression of chromaticity deviation due to the change in the value of electricity.

Furthermore, it was found that Comparative Example 19 having the thinner first organic layer and second organic layer (both 15 nm) had inferior efficiency and permanence as well as larger chromaticity deviation due to the change in the value of electricity, compared to the results of Examples 8 to 10.

Example 11

<Preparation of Blue Organic Electric Field Light-Emitting Element>

An organic electric field light-emitting element of Example 11 was prepared in the same manner as in Example 8, provided that in the first organic layer the amount of the first hole-transporting phosphorescent material and the amount of the first host material were respectively changed to 30% by mass, and 70% by mass, and the electron-trapping material of the second organic layer was changed from Pt complex B-1 to Pt complex B-2 expressed by the following structural formula.

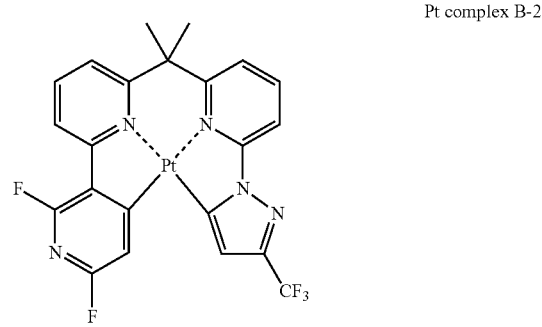

Pt complex B-2

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 12

<Preparation of Blue Organic Electric Field Light-Emitting Element>

An organic electric field light-emitting element of Example 12 was prepared in the same manner as in Example 11, provided that the first organic layer was changed to contain 69% by mass of Compound 1, 30% by mass of Ir complex B-1, and 1% by mass of Pt complex B-2 serving as the electron-trapping material, relative to the mass of the first organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 13

<Preparation of Blue Organic Electric Field Light-Emitting Element>

An organic electric field light-emitting element of Example 13 was prepared in the same manner as in Example 12, provided that in the first organic layer the amount of Compound 1, the amount of Ir complex B-1, and the amount of Pt complex B-2 were respectively changed to 67% by mass, 30% by mass, 3% by mass relative to the mass of the first organic layer, and in the second organic layer the amount of Compound 1, the amount of Ir complex B-1 and the amount of Pt complex B-2 were respectively changed to 82% by mass, 15% by mass, and 3% by mass relative to the mass of the second organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 20

<Preparation of Blue Organic Electric Field Light-Emitting Element>

An organic electric field light-emitting element of Comparative Example 20 was prepared in the same manner as in Example 11, provided that Pt complex B-2 was not added to the second organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 21

<Preparation of Blue Organic Electric Field Light-Emitting Element>

An organic electric field light-emitting element of Comparative Example 21 was prepared in the same manner as in Example 11, provided that the electron-trapping material of the second organic layer was changed from Pt complex B-2 to Ir complex B-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 22

<Preparation of Blue Organic Electric Field Light-Emitting Element>

An organic electric field light-emitting element of Comparative Example 22 was prepared in the same manner as in Example 12, provided that the electron-trapping material of the first organic layer and the electron-trapping material of the second organic layer were both changed from Pt complex B-2 to Ir complex B-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 23

<Preparation of Blue Organic Electric Field Light-Emitting Element>

An organic electric field light-emitting element of Comparative Example 23 was prepared in the same manner as in Example 13, provided that the electron-trapping material of the first organic layer and the electron-trapping material of the second organic layer were both changed from Pt complex B-2 to Ir complex B-2.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 24

<Preparation of Blue Organic Electric Field Light-Emitting Element>

An organic electric field light-emitting element of Comparative Example 24 was prepared in the same manner as in Example 12, provided that the amount of the electron-trapping material contained in the first organic layer and the amount of the electron-trapping material contained in the second organic layer were both changed from 1% by mass to 10% by mass, and the amount of Compound 1 contained in each of the first and second organic layer was changed from 69% by mass to 60% by mass.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 25

<Preparation of Blue Organic Electric Field Light-Emitting Element>

An organic electric field light-emitting element of Comparative Example 25 was prepared in the same manner as in Example 12, provided that the thickness of first organic layer and the thickness of the second organic layer were both changed from 30 nm to 15 nm.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

The results of the calculations of HOMO level and LUMO level of the materials used for Example 11 to 13 and Comparative Example 20 to 25, as well as the measurement results of the triplet level (T1) thereof are shown in Table 8. Note that, HOMO level and LUMO level are both calculation values, which are calculated by using a software for calculating molecular orbital, Gaussian 03, manufactured by Gaussian, Inc. (Gaussian 03, Revision D.02, M. J. Frisch, et. al., Gaussian, Inc., Wallingford Conn., 2004.) and obtained by structurally optimizing using B3LYP/6-31G* as a keyword.

TABLE 8

| | HOMO [eV] | LUMO [eV] | Triplet (T1) [eV] |
|---|---|---|---|
| Compound 1 | −5.39 | −1.17 | 2.86 |
| Ir complex B-1 | −4.57 | −0.77 | 2.75 |
| Pt complex B-1 | −6.26 | −2.25 | — |
| Ir complex B-2 | −4.55 | −0.76 | — |

The evaluation results (driving voltage, external quantum efficiency, permanence, and deviation in chromaticity) and structures of the organic electric field light-emitting elements prepared Examples 11 to 13 and Comparative Examples 20 to 25 are shown in Table 9.

5, provided that the material of the hole injection layer was changed from Ir complex G-1 to a mixture of 70% by mass of α-NPD and 30% by mass of MoO₃, the first hole-transporting

TABLE 9

|  |  | Ex. 11 | Ex. 12 | Ex. 13 | Comp. Ex. 20 | Comp. Ex. 21 | Comp. Ex. 22 | Comp. Ex. 23 | Comp. Ex. 24 | Comp. Ex. 25 |
|---|---|---|---|---|---|---|---|---|---|---|
| Hole injection layer (10 nm) |  | MoO₃ | MoO₃ | MoO₃ | MoO₃ | MoO₃ | MoO₃ | MoO₃ | MoO₃ | MoO₃ |
| 1st organic layer | 1st host (wt %) | C1 (70 wt %) | C1 (69 wt %) | C1 (67 wt %) | C1 (70 wt %) | C1 (70 wt %) | C1 (69 wt %) | C1 (67 wt %) | C1 (60 wt %) | C1 (69 wt %) |
|  | 1st phosphorescent (wt %) | Ir B-1 (30 wt %) | Ir B-1 (30 wt %) | Ir B-1 (30 wt %) | Ir B-1 (30 wt %) | Ir B-1 (30 wt %) | Ir B-1 (30 wt %) | Ir B-1 (30 wt %) | Ir B-1 (30 wt %) | Ir B-1 (30 wt %) |
|  | 1st trap (mass %) |  | Pt B-2 (1 wt %) | Pt B-2 (3 wt %) |  |  | Ir B-2 (1 wt %) | Ir B-2 (3 wt %) | Pt B-2 (10 wt %) | Pt B-2 (1 wt %) |
|  | Thickness [nm] | 30 | 30 | 30 | 30 | 30 | 30 | 30 | 30 | 15 |
| 2nd organic layer | 2nd host (wt %) | C1 (84 wt %) | C1 (84 wt %) | C1 (82 wt %) | C1 (85 wt %) | C1 (84 wt %) | C1 (84 wt %) | C1 (82 wt %) | C1 (75 wt %) | C1 (84 wt %) |
|  | 2nd phosphorescent (wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) |
|  | 2nd trap (mass %) | Pt B-2 (1 wt %) | Pt B-2 (1 wt %) | Pt B-2 (3 wt %) |  | Ir B-2 (1 wt %) | Ir B-2 (1 wt %) | Ir B-2 (3 wt %) | Pt B-2 (10 wt %) | Pt B-2 (1 wt %) |
|  | Thickness [nm] | 30 | 30 | 30 | 30 | 30 | 30 | 30 | 30 | 15 |
| Third organic layer (5 nm) |  | C1 | C1 | C1 | C1 | C1 | C1 | C1 | C1 | C1 |
| Electron transporting layer (45 nm) |  | Alq | Alq | Alq | Alq | Alq | Alq | Alq | Alq | Alq |
| Voltage [V] |  | 7.8 | 7.8 | 7.9 | 7.7 | 7.7 | 7.7 | 7.7 | 7.5 | 7.2 |
| EQE [%] |  | 11.0 | 12.5 | 12.0 | 8.3 | 8.2 | 8.3 | 8.2 | 9.0 | 7.5 |
| Permanence [h] |  | 640 | 650 | 660 | 420 | 420 | 420 | 420 | 460 | 350 |
| CIE (x, y) |  | 0.15, 0.27 | 0.15, 0.27 | 0.15, 0.27 | 0.15, 0.27 | 0.15, 0.27 | 0.15, 0.27 | 0.15, 0.27 | 0.15, 0.27 | 0.15, 0.27 |
| ΔChromaticity |  | 0.007 | 0.006 | 0.011 | 0.025 | 0.025 | 0.025 | 0.025 | 0.017 | 0.016 |

In Table 9, "1st host" denotes a first host material, "1st phosphorescent" denotes a first hole-transporting phosphorescent material, "1st trap" denotes an electron-trapping material contained in the first organic layer, "2nd host" denotes a second host material, "2nd phosphorescent" denotes a second hole-transporting phosphorescent material, "2nd trap" denotes an electron-trapping material contained in the second organic layer, "Ir B-1" "Ir B-2" and "Pt B-2" respectively denote Ir complex B-1, Ir complex B-2, and Pt complex B-2, and "C 1" denotes Compound 1. Moreover, in terms of the evaluations, the voltage, the external quantum efficiency (EQE), permanence, and CIE chromaticity (x, y) are all values at the luminance of 1,000 cd/m².

Examples 11 to 13 realized all of the improvement of efficiency and permanence, and suppression of the deviation in the chromaticity due to the change in the value for electricity, compared to the results of Comparative Example 20. It is assumed that the aforementioned effect is attained because the addition of the electron-trapping material presents the emission location from moving or sifting. Moreover, compared to the results of Comparative Examples 21 to 23 in which the electron-trapping material was changed to Ir complex B-2 having the lower LUMO level, Examples 11 to 13 were excellent in the efficiency, permanence, suppression of chromaticity deviation due to the change in the value of electricity.

Furthermore, it was found that Comparative Example 25 having the thinner first organic layer and second organic layer (both 15 nm) had inferior efficiency and permanence as well as larger chromaticity deviation due to the change in the value of electricity, compared to the results of Examples 11 to 13.

Example 14

<Preparation of Green Organic Electric Field Light-Emitting Element>

An organic electric field light-emitting element of Example 14 was prepared in the same manner as in Example 5, provided that the material of the hole injection layer was changed from Ir complex G-1 to a mixture of 70% by mass of α-NPD and 30% by mass of MoO₃, the first hole-transporting phosphorescent material of the first organic layer and the second hole-transporting phosphorescent material of the second organic layer were both changed from Ir complex G-1 to Ir complex B-1, the electron-trapping material of the second organic layer was changed from Pt complex G-2 to Pt complex G-1, and the material of the third organic layer was changed from Compound 2 to Compound 1.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 15

<Preparation of Green Organic Electric Field Light-Emitting Element>

An organic electric field light-emitting element of Example 15 was prepared in the same manner as in Example 14, provided that the first organic layer was changed to contain 69% by mass of Compound 1, 30% by mass of Ir complex B-1, and 1% by mass of Pt complex G-1 as the electron-trapping material, relative to the mass of the first organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Example 16

<Preparation of Green Organic Electric Field Light-Emitting Element>

An organic electric field light-emitting element of Example 16 was prepared in the same manner as in Example 15, provided that in the first organic layer the amount of Compound 1, the amount of Ir complex B-1, and the amount of Pt complex G-1 were respectively changed to 67% by mass, 30% by mass and 3% by mass, relative to the mass of the first organic layer, and in the second organic layer the amount of Compound 1, the amount of Ir complex B-1, and the amount of Pt complex G-1 were respectively changed to 82% by mass, 15% by mass, and 3% by mass, relative to the mass of the second organic layer.

The prepared organic electric field light-emitting element was evaluated in terms of its driving voltage, external quantum efficiency, permanence, chromaticity to change (Δ chromaticity), triplet level (T1) of the hole-blocking material, and triplet level (T1) of the hole-transporting phosphorescent material in the same manner as in Example 1.

Comparative Example 26

<Preparation of Green Organic Electric Field Light-Emitting Element>

An organic electric field light-emitting element of Comparative Example 26 was prepared in the same manner as in Example 14, provided that the electron-trapping material of the second organic layer was both changed from Pt complex G-1 to Ir complex G-1.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 27

<Preparation of Green Organic Electric Field Light-Emitting Element>

An organic electric field light-emitting element of Comparative Example 27 was prepared in the same manner as in Example 15, provided that the electron-trapping material of the first organic layer and the electron-trapping material of the second organic layer were both changed from Pt complex G-1 to Ir complex G-1.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 28

<Preparation of Green Organic Electric Field Light-Emitting Element>

An organic electric field light-emitting element of Comparative Example 28 was prepared in the same manner as in Example 16, provided that the electron-trapping material of the first organic layer and the electron-trapping material of the second organic layer were both changed from Pt complex G-1 to Ir complex G-1.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 29

<Preparation of Green Organic Electric Field Light-Emitting Element>

An organic electric field light-emitting element of Comparative Example 29 was prepared in the same manner as in Example 15, provided that in the first organic layer the amount of Compound 1, the amount of Ir complex B-1, and the amount of Pt complex G-1 were respectively changed to 60% by mass, 30% by mass, and 10% by mass, relative to the mass of the first organic layer, and in the second organic layer the amount of Compound 1, the amount of Ir complex B-1, and the amount of Pt complex G-1 were respectively changed to 75% by mass, 15% by mass, and 10% by mass, relative to the mass of the second organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 30

<Preparation of Green Organic Electric Field Light-Emitting Element>

An organic electric field light-emitting element of Comparative Example 30 was prepared in the same manner as in Example 15, provided that the thickness of the first organic layer and the thickness of the second organic layer were both changed from 30 nm to 15 nm.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

The evaluation results (driving voltage, external quantum efficiency, permanence, and deviation in chromaticity) and structures of the organic electric field light-emitting elements prepared Examples 14 to 16 and Comparative Examples 26 to 30 are shown in Table 10.

TABLE 10

| | | Ex. 14 | Ex. 15 | Ex. 16 | Comp. Ex. 26 | Comp. Ex. 27 | Comp. Ex. 28 | Comp. Ex. 29 | Comp. Ex. 30 |
|---|---|---|---|---|---|---|---|---|---|
| Hole injection layer (10 nm) | | NPD (70 wt %)/ $MoO_3$ (30 wt %) | NPD (70 wt %)/ $MoO_3$ (30 wt %) | NPD (70 wt %)/ $MoO_3$ (30 wt %) | NPD (70 wt %)/ $MoO_3$ (30 wt %) | NPD (70 wt %)/ $MoO_3$ (30 wt %) | NPD (70 wt %)/ $MoO_3$ (30 wt %) | NPD (70 wt %)/ $MoO_3$ (30 wt %) | NPD (70 wt %)/ $MoO_3$ (30 wt %) |
| 1st organic layer | 1st host (wt %) | C1 (70 wt %) | C1 (69 wt %) | C1 (67 wt %) | C1 (70 wt %) | C1 (69 wt %) | C1 (67 wt %) | C1 (60 wt %) | C1 (69 wt %) |
| | 1st phosphorescent (wt %) | Ir B-1 (30 wt %) | Ir B-1 (30 wt %) | Ir B-1 (30 wt %) | Ir B-1 (30 wt %) | Ir B-1 (30 wt %) | Ir B-1 (30 wt %) | Ir B-1 (30 wt %) | Ir B-1 (30 wt %) |

TABLE 10-continued

| | | Ex. 14 | Ex. 15 | Ex. 16 | Comp. Ex. 26 | Comp. Ex. 27 | Comp. Ex. 28 | Comp. Ex. 29 | Comp. Ex. 30 |
|---|---|---|---|---|---|---|---|---|---|
| | $1^{st}$ trap (mass %) | | Pt G-1 (1 wt %) | Pt G-1 (3 wt %) | | Ir G-1 (1 wt %) | Ir G-1 (3 wt %) | Pt G-1 (10 wt %) | Pt G-1 (1 wt %) |
| | Thickness [nm] | 30 | 30 | 30 | 30 | 30 | 30 | 30 | 15 |
| $2^{nd}$ organic layer | $2^{nd}$ host (wt %) | C1 (84 wt %) | C1 (84 wt %) | C1 (82 wt %) | C1 (84 wt %) | C1 (84 wt %) | C1 (82 wt %) | C1 (75 wt %) | C1 (84 wt %) |
| | $2^{nd}$ phosphorescent (wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) | Ir B-1 (15 wt %) |
| | $2^{nd}$ trap (mass %) | Pt G-1 (1 wt %) | Pt G-1 (1 wt %) | Pt G-1 (3 wt %) | Ir G-1 (1 wt %) | Ir G-1 (1 wt %) | Ir G-1 (3 wt %) | Pt G-1 (10 wt %) | Pt G-1 (1 wt %) |
| | Thickness [nm] | 30 | 30 | 30 | 30 | 30 | 30 | 30 | 15 |
| Third organic layer (5 nm) | | C1 | C1 | C1 | C1 | C1 | C1 | C1 | C1 |
| Electron transporting layer (45 nm) | | Alq | Alq | Alq | Alq | Alq | Alq | Alq | Alq |
| Voltage [V] | | 7.8 | 7.8 | 7.9 | 7.7 | 7.7 | 7.7 | 7.5 | 7.2 |
| EQE [%] | | 12.0 | 13.0 | 14.0 | 8.2 | 8.3 | 8.2 | 9.0 | 7.5 |
| Permanence [h] | | 2,500 | 2,800 | 2,600 | 1,500 | 1,500 | 1,500 | 1,800 | 800 |
| CIE (x, y) | | 0.15, 0.27 | 0.15, 0.27 | 0.15, 0.27 | 0.15, 0.27 | 0.15, 0.27 | 0.15, 0.27 | 0.15, 0.27 | 0.15, 0.27 |
| ΔChromaticity | | 0.007 | 0.006 | 0.011 | 0.025 | 0.025 | 0.025 | 0.017 | 0.016 |

In Table 10, "$1^{st}$ host" denotes a first host material, "$1^{st}$ phosphorescent" denotes a first hole-transporting phosphorescent material, "$1^{st}$ trap" denotes an electron-trapping material contained in the first organic layer, "$2^{nd}$ host" denotes a second host material, "$2^{nd}$ phosphorescent" denotes a second hole-transporting phosphorescent material, "$2^{nd}$ trap" denotes an electron-trapping material contained in the second organic layer, "Ir G-1" "Ir B-1" and "Pt G-1" respectively denote Ir complex G-1, Ir complex B-1, and Pt complex G-1, and "C 1" denotes Compound 1. Moreover, in terms of the evaluations, the voltage, the external quantum efficiency (EQE), permanence, and CIE chromaticity (x, y) are all values at the luminance of 1,000 cd/m².

In the organic electric field light-emitting elements of Examples 14 to 16 and Comparative Examples 26 to 28, the electron-trapping material is used as a main source for emission, and thus these elements are green organic electric field light-emitting elements.

Examples 14 to 16 realized all of the improvement of efficiency and permanence, and suppression of the deviation in the chromaticity due to the change in the value for electricity, compared to the results of Comparative Example 26. It is assumed that the aforementioned effect is attained because the addition of the electron-trapping material presents the emission location from moving or sifting. Moreover, compared to the results of Comparative Examples 27 to 28 in which the electron-trapping material was changed to Ir complex G-1 having the lower LUMO level, Examples 14 to 16 were excellent in the efficiency, permanence, suppression of chromaticity deviation due to the change in the value of electricity.

Furthermore, it was found that Comparative Example 30 having the thinner first organic layer and second organic layer (both 15 nm) had inferior efficiency and permanence as well as larger chromaticity deviation due to the change in the value of electricity, compared to the results of Examples 14 to 16.

Example 17

<Preparation of White Organic Electric Field Light-Emitting Element>

An organic electric field light-emitting element of Example 17 was prepared in the same manner as in Example 14, provided that the first organic layer was changed to contain 69.9% by mass of Compound 1, 30% by mass of Ir complex B-1, and as an additional component, 0.1% by mass of Ir complex R-1 expressed by the following structural formula, the second organic layer was changed to contain 84.4% by mass of Compound 1, 15% by mass of Ir complex B-1, 0.5% by mass of Pt complex G-1, and as an additional component 0.1% by mass of Ir complex R-1 expressed by the following structural formula, and the material of electron transporting layer was changed from Alq to Compound 4 expressed by the following structural formula.

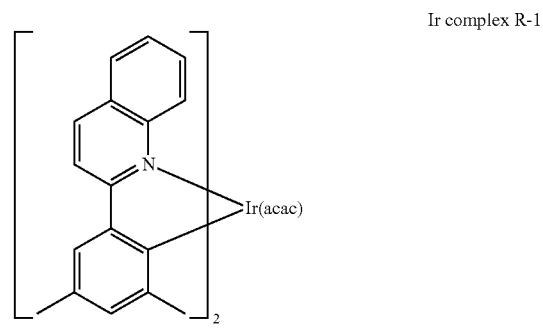

Ir complex R-1

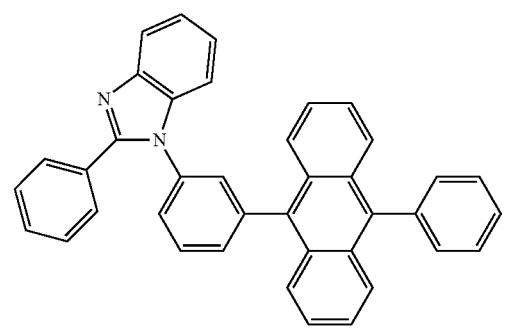

Compound 4

Example 18

<Preparation of White Organic Electric Field Light-Emitting Element>

An organic electric field light-emitting element of Example 18 was prepared in the same manner as in Example 17, provided that the first organic layer was changed to contain 69.4% by mass of Compound 1, 30% by mass of Ir complex B-1, 0.1% by mass of Ir complex R-1, and 0.5% by mass of Pt complex G-1 as electron-trapping material, relative to the mass of the first organic layer.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 31

<Preparation of White Organic Electric Field Light-Emitting Element>

An organic electric field light-emitting element of Comparative Example 31 was prepared in the same manner as in Example 17, provided that the electron-trapping material of the second organic layer was changed from Pt complex G-1 to Ir complex G-1.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 32

<Preparation of White Organic Electric Field Light-Emitting Element>

An organic electric field light-emitting element of Comparative Example 32 was prepared in the same manner as in Example 18, provided that the electron-trapping material of the first organic layer and the electron-trapping material of the second organic layer were both changed from Pt complex G-1 to Ir complex G-1.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

Comparative Example 33

<Preparation of White Organic Electric Field Light-Emitting Element>

An organic electric field light-emitting element of Comparative Example 33 was prepared in the same manner as in Example 18, provided that the thickness of the first organic layer and the thickness of the second organic layer were both changed from 30 nm to 15 nm.

The prepared organic electric field light-emitting element was evaluated in terms of its driving voltage, external quantum efficiency, permanence, chromaticity change (Δ chromaticity), triplet level (T1) of the hole-blocking material, and triplet level (T1) of the hole-transporting phosphorescent material in the same manner as in Example 1.

The evaluation results (driving voltage, external quantum efficiency, permanence, and deviation in chromaticity) and structures of the organic electric field light-emitting elements prepared Examples 17 to 18 and Comparative Examples 31 to 33 are shown in Table 11.

TABLE 11

| | | Ex. 17 | Ex. 18 | Comp. Ex. 31 | Comp. Ex. 32 | Comp. Ex. 33 |
|---|---|---|---|---|---|---|
| Hole injection layer (10 nm) | | NPD (70 wt %)/ MoO$_3$ (30 wt %) | NPD (70 wt %)/ MoO$_3$ (30 wt %) | NPD (70 wt %)/ MoO$_3$ (30 wt %) | NPD (70 wt %)/ MoO$_3$ (30 wt %) | NPD (70 wt %)/ MoO$_3$ (30 wt %) |
| 1$^{st}$ organic layer | 1$^{st}$ host (wt %) | C1 (69.9 wt %) | C1 (69.4 wt %) | C1 (69.9 wt %) | C1 (69.4 wt %) | C1 (69.4 wt %) |
| | 1$^{st}$ phosphorescent (wt %) | Ir B-1 (30 wt %) | Ir B-1 (30 wt %) | Ir B-1 (30 wt %) | Ir B-1 (30 wt %) | Ir B-1 (30 wt %) |
| | 1$^{st}$ trap (mass %) | | Pt G-1 (0.5 wt %) | | Ir G-1 (0.5 wt %) | Ir G-1 (0.5 wt %) |
| | Additional | Ir R-1 (0.1 wt %) | Ir R-1 (0.1 wt %) | Ir R-1 (0.1 wt %) | Ir R-1 (0.1 wt %) | Ir R-1 (0.1 wt %) |
| | Thickness [nm] | 30 | 30 | 30 | 30 | 15 |
| 2$^{nd}$ organic layer | 2$^{nd}$ host (wt %) | C1 (84.4 wt %) | C1 (84.4 wt %) | C1 (84.4 wt %) | C1 (84.4 wt %) | C1 (84.4 wt %) |
| | 2$^{nd}$ phosphorescent (wt %) | Ir B-1 (15 wt %) | Ir B-1 (15 wt %) | Ir B-1 (15 wt %) | Ir B-1 (15 wt %) | Ir B-1 (15 wt %) |
| | 2$^{nd}$ trap (mass %) | Pt G-1 (0.5 wt %) | Pt G-1 (0.5 wt %) | Ir G-1 (0.5 wt %) | Ir G-1 (0.5 wt %) | Pt G-1 (0.5 wt %) |
| | Additional | Ir R-1 (0.1 wt %) | Ir R-1 (0.1 wt %) | Ir R-1 (0.1 wt %) | Ir R-1 (0.1 wt %) | Ir R-1 (0.1 wt %) |
| | Thickness [nm] | 30 | 30 | 30 | 30 | 15 |
| Third organic layer (5 nm) | | C1 | C1 | C1 | C1 | C1 |
| Electron transporting layer (45 nm) | | C4 | C4 | C4 | C4 | C4 |
| Voltage [V] | | 6.8 | 6.9 | 6.7 | 6.7 | 6.2 |
| EQE [%] | | 13.0 | 13.3 | 11.5 | 12.0 | 10.0 |
| Permanence [h] | | 4,000 | 5,000 | 2,500 | 2,600 | 2,400 |
| CIE (x, y) | | 0.35, 0.50 | 0.35, 0.52 | 0.34, 0.51 | 0.33, 0.52 | 0.32, 0.52 |
| ΔChromaticity | | 0.18 | 0.15 | 0.30 | 0.30 | 0.32 |

In Table 11, "1$^{st}$ host" denotes a first host material, "1$^{st}$ phosphorescent" denotes a first hole-transporting phosphorescent material, "1$^{st}$ trap" denotes an electron-trapping material contained in the first organic layer, "2$^{nd}$ host" denotes a second host material, "2$^{nd}$ phosphorescent" denotes a second hole-transporting phosphorescent material, "2$^{nd}$ trap" denotes an electron-trapping material contained in the second organic layer, "Ir G-1", "Ir B-1", and "Ir R-1" respectively denote Ir complex G-1, Ir complex B-1, and Ir complex R-1, and "C 1" and "C 4" respectively denote Compound 1 and Compound 4. Moreover, in terms of the evaluations, the voltage, the external quantum efficiency (EQE), permanence, and CIE chromaticity (x, y) are all values at the luminance of 1,000 cd/m$^2$.

Examples 17 to 18 realized all of the improvement of efficiency and permanence, and suppression of the deviation in the chromaticity due to the change in the value for electricity, compared to the results of Comparative Example 31. It is assumed that the aforementioned effect is attained because the addition of the electron-trapping material presents the emission location from moving or sifting. Moreover, compared to the results of Comparative Examples 31 to 32 in which the electron-trapping material was changed to Ir complex G-1 having the lower LUMO level, Examples 17 to 18 were excellent in the efficiency, permanence, suppression of chromaticity deviation due to the change in the value of electricity.

Furthermore, it was found that Comparative Example 33 having the thinner first organic layer and second organic layer (both 15 nm) had inferior efficiency and permanence as well as larger chromaticity deviation due to the change in the value of electricity, compared to the results of Examples 17 to 18.

Since the organic electric field light-emitting element of the present invention can improve the permanence and emission efficiency thereof as well as minimizing the shifting of the emission location and chromaticity deviation due to the change in the value of electric current applied. Accordingly, the organic electric field light-emitting element of the present invention is suitably used for a display element, a display, a back light, electrophotography, a illumination light source, a recording light source, an exposure light source, a reading light source, an indicator, a signboard, interior decoration, and optical communication.

What is claimed is:

1. An organic electric field light-emitting element, comprising:
an anode;
a cathode; and
an organic layer containing a first organic layer, a second organic layer, and a third organic layer, provided between the anode and the cathode, where the first organic layer, the second organic layer, and the third organic layer are laminated in this order from the side of the anode,
wherein the first organic layer contains a first host material and a first hole-transporting phosphorescent material, and the amount of the first host material and the amount of the first host hole-transporting phosphorescent material in the first organic layer are 10% by mass to 90% by mass, and 10% by mass to 90% by mass, respectively,
wherein the second organic layer contains a second host material, a second hole-transporting phosphorescent material, and an electron-trapping material, and the amount of the second host material, the amount of the second hole-transporting phosphorescent material, and the amount of the electron-trapping material in the second organic layer are 65% by mass to 96.9% by mass, 3% by mass to 30% by mass, and 0.1% by mass to 5% by mass, respectively,
wherein the third organic layer contain a hole-blocking material whose triplet excitation level (T1) is higher than the triplet excitation level (T1) of the second hole-transporting phosphorescent material by at least 0.1 eV,
wherein the second host material, the second hole-transporting phosphorescent material, and the electron-trapping material satisfy the relationship expressed by the following formulae:

$|HOMO_{t2}|>|HOMO_{h2}|$ $|HOMO_{t2}|>|HOMO_{p2}|$ $|LUMO_{h2}|+0.25\ eV<|LUMO_{t2}|$ $|LUMO_{p2}|+0.25\ eV<|LUMO_{t2}|$ where $HOMO_{t2}$ is the HOMO level of the electron-trapping material contained in the second organic layer, $HOMO_{h2}$ is the HOMO level of the second host material, $HOMO_{p2}$ is the HOMO level of the second hole-transporting phosphorescent material, $LUMO_{h2}$ is the LUMO level of the second host material, $LUMO_{t2}$ is the LUMO level of the electron-trapping material contained in the second organic layer, and $LUMO_{p2}$ is the LUMO level of the second hole-transporting phosphorescent material, and
wherein the total of the average thickness of the first organic layer and the average thickness of the second organic layer is at least 40 nm.

2. The organic electric field light-emitting element according to claim 1, wherein the first organic layer further contains 0.1% by mass to 5% by mass of an electron-trapping material, and the first host material, the first hole-transporting phosphorescent material, and the electron-trapping material satisfy the relationship expressed by the following formulae:

$|HOMO_{t1}|>|HOMO_{h1}|$ $|HOMO_{t1}|>|HOMO_{p1}|$ $|LUMO_{h1}|+0.25\ eV<|LUMO_{t1}|$ $|LUMO_{p1}|+0.25\ eV<|LUMO_{t1}|$ where $HOMO_{t1}$ is the HOMO level of the electron-trapping material contained in the first organic layer, $HOMO_{h1}$ is the HOMO level of the first host material, $HOMO_{p1}$ is the HOMO level of the first hole-transporting phosphorescent material, $LUMO_{h1}$ is the LUMO level of the first host material, $LUMO_{t1}$ is the LUMO level of the electron-trapping material contained in the first organic layer, and $LUMO_{p1}$ is the LUMO level of the first hole-transporting phosphorescent material.

3. The organic electric field light-emitting element according to claim 1, wherein the electron-trapping material is an electron-transporting phosphorescent material.

4. The organic electric field light-emitting element according to claim 1, wherein the amount of the first hole-transporting phosphorescent material is larger than the amount of the second hole-transporting phosphorescent material by at least 10% by mass.

5. The organic electric field light-emitting element according to claim 1, wherein the first hole-transporting phosphorescent material and the second hole-transporting phosphorescent material are both iridium complexes.

6. The organic electric field light-emitting element according to claim 1, wherein the electron-trapping material is a platinum complex.

* * * * *